US011722098B2

(12) United States Patent
Matsuo et al.

(10) Patent No.: US 11,722,098 B2
(45) Date of Patent: *Aug. 8, 2023

(54) VIBRATOR AND OSCILLATOR

(71) Applicant: SEIKO EPSON CORPORATION, Tokyo (JP)

(72) Inventors: Atsushi Matsuo, Shiojiri (JP); Ryuta Nishizawa, Nagano (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/691,410

(22) Filed: Mar. 10, 2022

(65) Prior Publication Data

US 2022/0294392 A1     Sep. 15, 2022

(30) Foreign Application Priority Data

Mar. 12, 2021   (JP) ................................ 2021-040000

(51) Int. Cl.
| H03B 5/04 | (2006.01) |
| H03B 5/36 | (2006.01) |
| H03H 9/13 | (2006.01) |
| H03H 9/17 | (2006.01) |
| H10N 30/20 | (2023.01) |

(52) U.S. Cl.
CPC ............... *H03B 5/04* (2013.01); *H03B 5/36* (2013.01); *H03H 9/13* (2013.01); *H03H 9/17* (2013.01); *H10N 30/2041* (2023.02)

(58) Field of Classification Search
CPC ....................................................... H03B 5/04

USPC ........................................................ 331/66
See application file for complete search history.

(56) References Cited

U.S. PATENT DOCUMENTS

| 5,214,668 | A | 5/1993 | Satou et al. | |
| 8,179,201 | B2* | 5/2012 | Lander | B81B 3/0072 |
| | | | | 333/229 |
| 8,504,164 | B2* | 8/2013 | Karr | A61N 1/37276 |
| | | | | 331/66 |

FOREIGN PATENT DOCUMENTS

| JP | 4-363913 | 12/1992 |
| JP | 2013-098841 | 5/2013 |

* cited by examiner

*Primary Examiner* — Joseph Chang
(74) *Attorney, Agent, or Firm* — Rankin, Hill & Clark LLP

(57) ABSTRACT

A vibrator includes: a vibration element that includes a pair of first excitation electrodes formed at the first vibration portion, a pair of second excitation electrodes formed at the second vibration portion, and a pair of third excitation electrodes formed at the third vibration portion, in which one second excitation electrode of the pair of second excitation electrodes is formed at a first inclined surface that is inclined with respect to two main surfaces, and one third excitation electrode of the pair of third excitation electrodes is formed at a second inclined surface that is inclined with respect to the two main surfaces and the first inclined surface; and a package that houses the vibration element. The vibration element includes a fixing portion to be fixed to the package. The fixing portion is provided between the first vibration portion and the second and third vibration portions.

15 Claims, 19 Drawing Sheets

VIBRATOR AND OSCILLATOR

The present application is based on, and claims priority from JP Application Serial Number 2021-040000, filed Mar. 12, 2021, the disclosure of which is hereby incorporated by reference herein in its entirety.

BACKGROUND

1. Technical Field

The present disclosure relates to a vibrator and an oscillator.

2. Related Art

In order to obtain a stable frequency signal over a wide temperature range, a temperature compensated crystal oscillator (TCXO) including a temperature detection element and a temperature compensation circuit is widely used. However, in the TCXO, since a vibration element made of quartz and the temperature detection element are separately provided, a detection error occurs between a temperature detected by the temperature detection element and a temperature of the vibration element, and it is difficult to perform highly accurate temperature compensation.

Therefore, JP-A-2013-98841 discloses a piezoelectric vibrator in which a first vibration portion for oscillation signal output and a second vibration portion for temperature detection are provided at a common piezoelectric plate. Since the two vibration portions are formed at the common piezoelectric plate, heat transfer between the first vibration portion and the second vibration portion is quickly performed. Therefore, as compared to a case in which an oscillation signal output element and a temperature detection element are separately provided, a detection error between a temperature detected by the second vibration portion for temperature detection and a temperature of the first vibration portion for oscillation signal output is reduced, and it is possible to perform highly accurate temperature compensation.

However, in the piezoelectric vibrator described in JP-A-2013-98841, when the piezoelectric plate in which excitation electrodes are formed at the first vibration portion and the second vibration portion is mounted in a package, both ends of the piezoelectric plate in a longitudinal direction are fixed by conductive bumps. In the piezoelectric plate, the first vibration portion and the second vibration portion are arranged side by side. Therefore, although heat applied to the piezoelectric vibrator is transferred to the piezoelectric plate via the conductive bump, since positions of the conductive bumps are far apart, there is a risk that a temperature difference occurs between the first vibration portion and the second vibration portion, and there is a problem that the temperature of the first vibration portion for oscillation signal output cannot be accurately detected.

SUMMARY

A vibrator includes: a vibration element that includes a crystal substrate that includes a first vibration portion, a second vibration portion that is provided on one side of the first vibration portion in a first direction, and a third vibration portion that is provided on the one side and that is provided side by side with the second vibration portion along a second direction orthogonal to the first direction, a pair of first excitation electrodes formed at two main surfaces of the crystal substrate in the first vibration portion, a pair of second excitation electrodes that sandwich the second vibration portion in a thickness direction of the crystal substrate in the second vibration portion, in which at least one second excitation electrode of the pair of second excitation electrodes is formed at a first inclined surface that is inclined with respect to the two main surfaces, and a pair of third excitation electrodes that sandwich the third vibration portion in the thickness direction of the crystal substrate in the third vibration portion, in which at least one third excitation electrode of the pair of third excitation electrodes is formed at a second inclined surface that is inclined with respect to the two main surfaces and the first inclined surface; and a package that houses the vibration element. The vibration element includes a fixing portion to be fixed to the package. The fixing portion is provided between the first vibration portion and the second and third vibration portions.

An oscillator includes: the above-described vibrator; a first oscillation circuit that is electrically coupled to a first excitation electrode and that outputs a first oscillation signal; a second oscillation circuit that is electrically coupled to a second excitation electrode and that outputs a second oscillation signal; a third oscillation circuit that is electrically coupled to a third excitation electrode and that outputs a third oscillation signal; and a control signal output circuit to which at least one of the second oscillation signal and the third oscillation signal is input and that outputs, based on the input signal, a control signal for controlling an oscillation frequency of the first oscillation signal.

DESCRIPTION OF EXEMPLARY EMBODIMENTS

1. First Embodiment 1.1. Vibrator

First, a schematic configuration of a vibrator 100 according to a first embodiment will be described with reference to FIGS. 1, 2, 3, and 4 by taking a configuration using a relay substrate 20 as an example.

Figure 1:
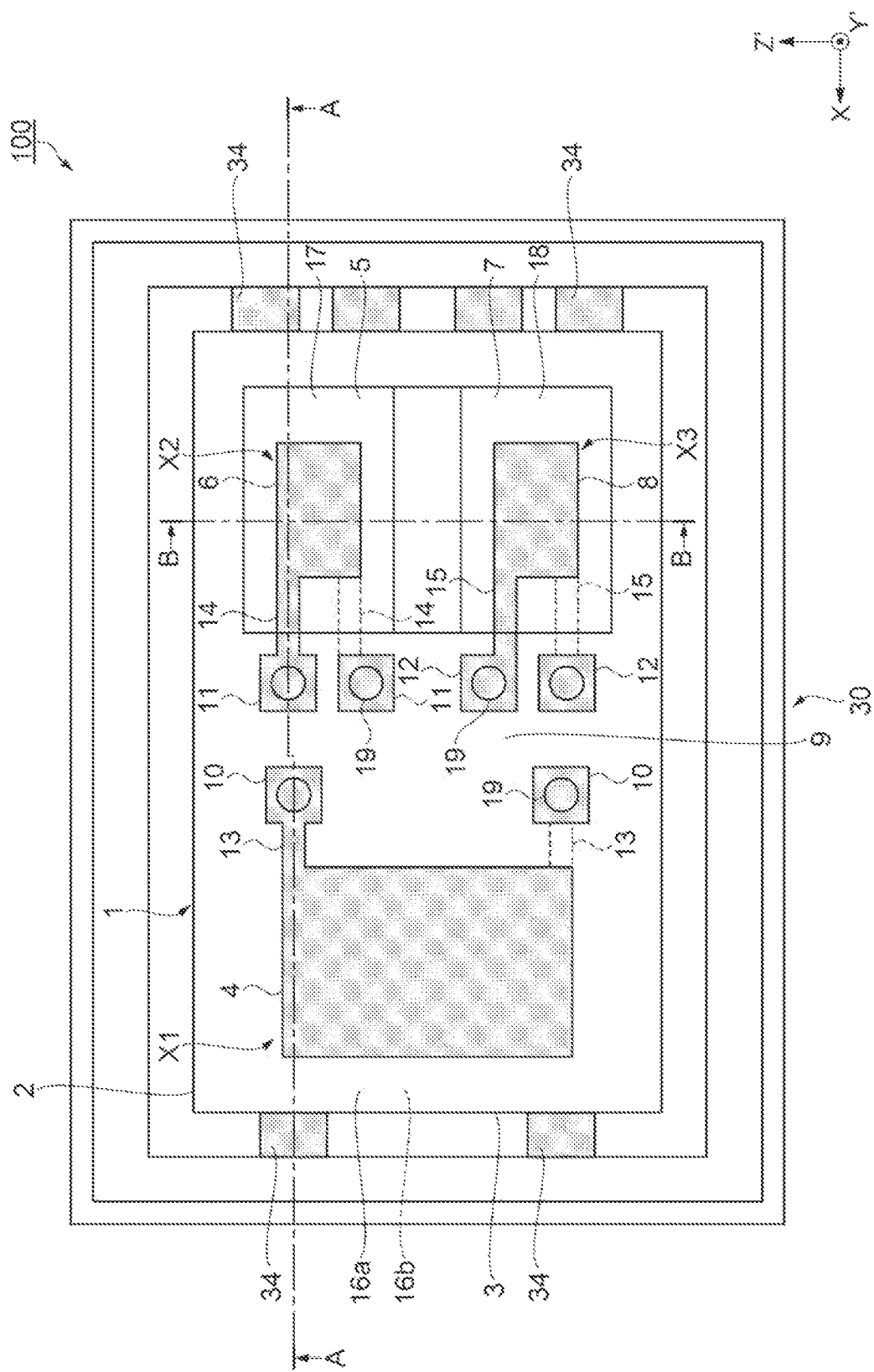
FIG. 1 is a plan view showing a vibrator according to a first embodiment.

FIG. 1 shows a state in which a lid member 36 is removed for convenience of description of an internal configuration of the vibrator 100. A Y' axis and a Z' axis in FIGS. 1 to 5 and 8 to 25 are axes defined by rotating a Y axis and a Z axis by a predetermined angle around an X axis among the X axis, the Y axis, and the Z axis orthogonal to one another. A direction along the X axis is referred to as an "X direction", a direction along the Y' axis is referred to as a "Y' direction", and a direction along the Z' axis is referred to as a "Z' direction". In the present embodiment, the X direction corresponds to a first direction, and the Z' direction corresponds to a second direction.

Figure 2:
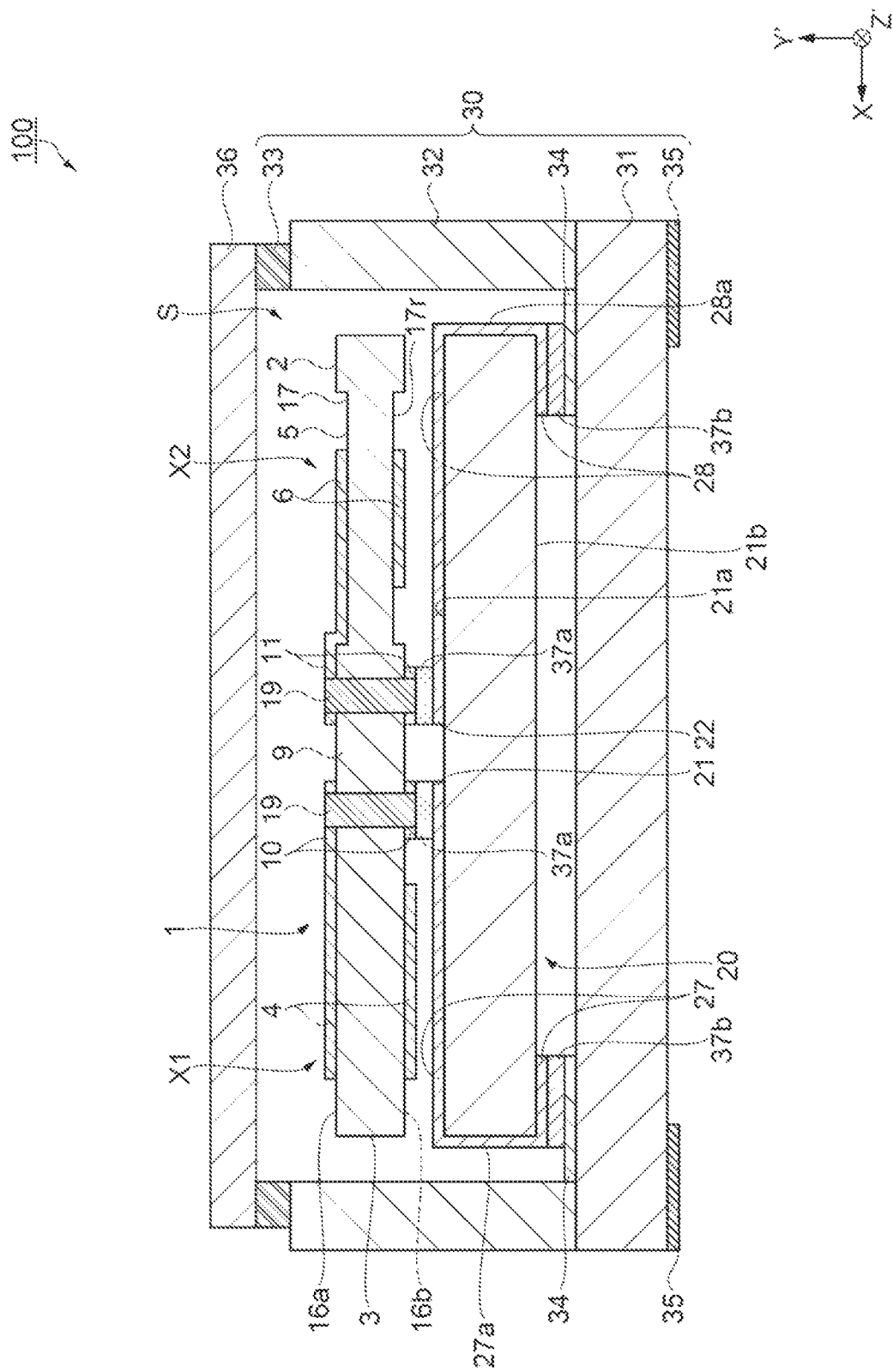
FIG. 2 is a cross-sectional view taken along a line A-A in FIG. 1.

As shown in FIGS. 1 and 2, the vibrator 100 according to the present embodiment includes a vibration element 1 including a first vibration element X1, a second vibration element X2, and a third vibration element X3, the relay substrate 20 that fixes the vibration element 1, a package 30 that houses the vibration element 1 and the relay substrate 20, and the lid member 36 made of glass, ceramic, metal, or the like.

As shown in FIG. 2, the package 30 is formed by stacking mounting terminals 35, a first substrate 31, second substrates 32, and seal rings 33. The package 30 has a cavity S that opens upward. An inside of the cavity S that accommodates the vibration element 1 and the relay substrate 20 is hermetically sealed in a reduced-pressure atmosphere or an inert gas atmosphere such as nitrogen by bonding the lid member 36 to the seal ring 33.

The vibration element 1 and the relay substrate 20 are accommodated in the cavity S of the package 30. At a plurality of through electrodes 19 provided at a fixing portion 9, the vibration element 1 is electrically coupled to, via a bonding member 37a such as a metal bump, solder, or a conductive adhesive, fixing terminals 21, 22, and 23 provided above the relay substrate 20, and is fixed to the relay substrate 20. At coupling terminals 27, 28, and 29 provided at both end portions of the relay substrate 20 in the X direction, the relay substrate 20 is electrically coupled to, via a bonding member 37b such as a conductive adhesive, an internal terminal 34 provided above the first substrate 31, and is fixed to the first substrate 31. That is, at the fixing portion 9, the vibration element 1 is fixed to the relay substrate 20, and is fixed to the package 30 via the relay substrate 20. The relay substrate 20 is fixed to the package 30 at both the end portions of the relay substrate 20. The fixing portion 9 of the vibration element 1 is fixed to the relay substrate 20 at a central portion sandwiched between both the end portions of the relay substrate 20.

A plurality of mounting terminals 35 are provided at an outer bottom surface of the first substrate 31. The mounting terminal 35 is electrically coupled to, via a through electrode or an interlayer wiring (not shown), the internal terminal 34 provided above the first substrate 31.

The first substrate 31 and the second substrate 32 of the package 30 are made of an insulating material. Such a material is not particularly limited, and for example, various types of ceramics such as oxide-based ceramics, nitride-based ceramics, and carbide-based ceramics can be used. The internal terminals 34, the mounting terminal 35, and the like provided in the package 30 are generally formed by screen-printing and firing a metal wiring material such as tungsten (W) or molybdenum (Mo) on an insulating material, and plating nickel (Ni), gold (Au), or the like on the material.

Figure 3:
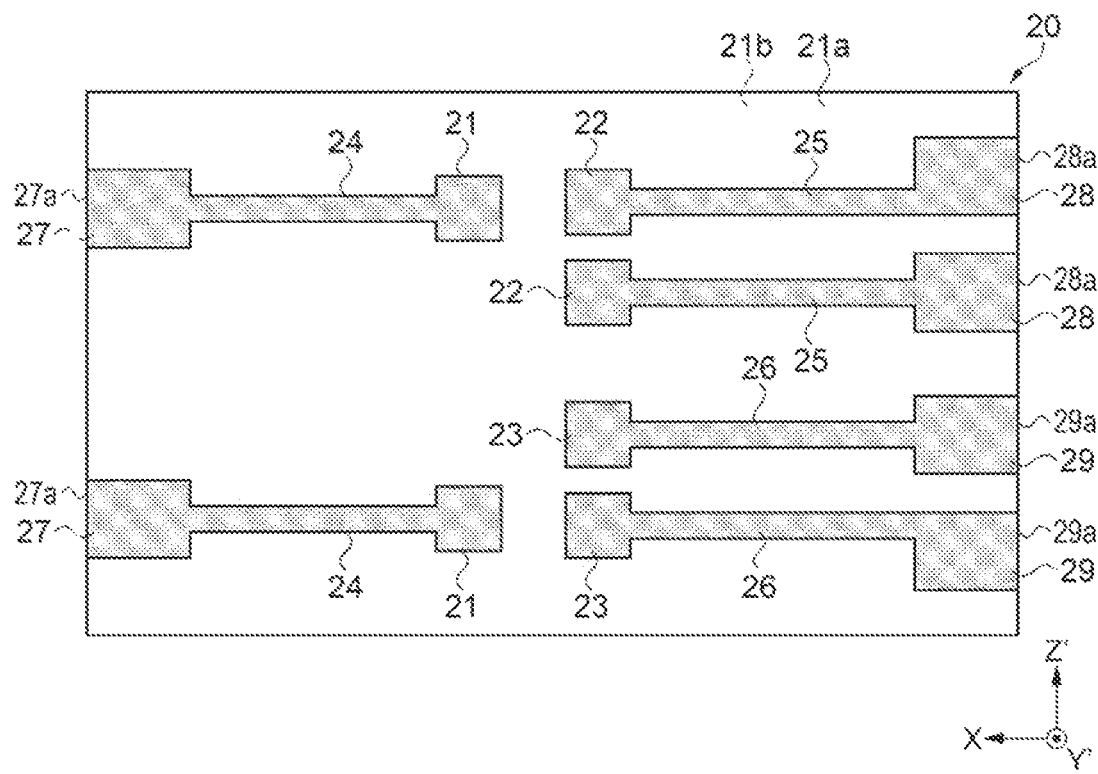
FIG. 3 is a plan view showing a relay substrate.

As shown in FIG. 3, the relay substrate 20 is a rectangular flat plate that has, with a XZ' plane as a main surface, a first main surface 21a and a second main surface 21b parallel to the first main surface 21a. In the relay substrate 20, a longitudinal direction is the X direction and a thickness direction is the Y' direction.

At the first main surface 21a, a plurality of fixing terminals 21, 22, and 23 are formed at the central portion of the relay substrate 20, and a plurality of coupling terminals 27, 28, and 29 are formed at both the end portions of the relay substrate 20 in the X direction. The fixing terminal 21, the fixing terminal 22, and the fixing terminal 23 respectively overlap with terminals 10 formed at the vibration element 1, terminals 11 formed at the vibration element 1, and terminals 12 formed at the vibration element 1, in plan view from the Y' direction. A coupling electrode 24 that electrically couples the fixing terminal 21 and the coupling terminal 27, a coupling electrode 25 that electrically couples the fixing terminal 22 and the coupling terminal 28, and a coupling electrode 26 that electrically couples the fixing terminal 23 and the coupling terminal 29 are formed.

The vibration element 1 is fixed, via the bonding member 37a, above the fixing terminals 21, 22, and 23 formed at the first main surface 21a. That is, the relay substrate fixes the vibration element 1 at the central portion sandwiched between both the end portions of the relay substrate 20.

At the second main surface 21b, the plurality of coupling terminals 27, 28, and 29 are formed at both the end portions of the relay substrate 20 in the X direction at positions overlapping the coupling terminals 27, 28, and 29 formed at the first main surface 21a in plan view from the Y' direction. As shown in FIGS. 2 and 3, the coupling terminals 27, 28, and 29 formed at the first main surface 21a and the coupling terminals 27, 28, and 29 formed at the second main surface 21b are electrically coupled by side electrodes 27a, 28a, and 29a formed at side surfaces of the relay substrate 20, respectively.

The coupling terminals 27, 28, and 29 formed at the second main surface 21b are fixed to the first substrate 31 of the package 30 via the bonding member 37b. That is, the relay substrate 20 is fixed to the package 30 at both the end portions of the relay substrate 20.

In the present embodiment, since the vibration element 1 is fixed to the package 30 via the relay substrate 20, heat from an outside of the package 30 is less likely to be transferred to the vibration element 1. In the present embodiment, the vibration element 1 is fixed to the package 30 via the relay substrate 20. However, the present disclosure is not limited thereto, and the fixing portion 9 of the vibration element 1 may be directly fixed to the package 30.

The relay substrate 20 is made of an insulating material. Such a material is not particularly limited, and for example, various ceramics such as oxide-based ceramics, nitride-based ceramics, and carbide-based ceramics, glass, quartz, and the like can be used.

As shown in FIG. 1, the vibration element 1 includes: a crystal substrate 2 including a first vibration portion 3, a second vibration portion 5, and a third vibration portion 7; a first excitation electrode 4 formed at the first vibration portion 3; a second excitation electrode 6 formed at the second vibration portion 5; a third excitation electrode 8 formed at the third vibration portion 7; terminals 10, 11, and 12 formed at the fixing portion 9 located at a central portion of the crystal substrate 2 in the X direction; lead electrodes 13 that electrically couple the first excitation electrode 4 and the terminals 10; lead electrodes 14 that electrically couple the second excitation electrode 6 and the terminals 11; lead electrodes 15 that electrically couple the third excitation electrode 8 and the terminals 12; and through electrodes 19 that penetrate the crystal substrate 2 and that are formed by embedding a metal in a through hole. The through electrode 19 may be formed by stacking a metal on an inner wall of the through hole.

The vibration element 1 includes the first vibration element X1, the second vibration element X2, and the third vibration element X3. The first vibration element X1 includes the first vibration portion 3 in which a pair of first excitation electrodes 4 is formed. The second vibration element X2 includes the second vibration portion in which a pair of second excitation electrodes 6 is formed. The third vibration element X3 includes the third vibration portion 7 in which a pair of third excitation electrodes 8 is formed. Since the first vibration element X1, the second vibration element X2, and the third vibration element X3 share the crystal substrate 2, heat from the outside is likely to be uniformly transferred.

The crystal substrate 2 includes: the first vibration portion 3; the second vibration portion 5 provided on one side of the first vibration portion 3 in the X direction serving as the first direction; the third vibration portion 7 that is provided on one side of the first vibration portion 3 in the X direction and that is provided side by side with the second vibration portion 5 along the Z' direction serving as the second direction orthogonal to the X direction; and the fixing portion 9 that is located between the first vibration portion 3 and the second and third vibration portions 5 and 7, and that fixes the crystal substrate 2 to the relay substrate 20. The crystal substrate 2 is a flat plate that has, with the XZ' plane serving as a main surface, a first main surface 16a, and a second main surface 16b parallel to the first main surface 16a. In the crystal substrate 2, a thickness direction is the Y' direction.

The first vibration portion 3, the fixing portion 9, the second vibration portion 5, and the third vibration portion 7 are arranged side by side in the X direction. The fixing portion 9 is provided at the central portion of the crystal substrate 2 in the X direction. That is, the first vibration portion 3 and the second and third vibration portions 5 and 7 are arranged with the fixing portion 9 sandwiched therebetween. Therefore, heat from the outside of the package 30 is likely to be uniformly transferred to the first vibration portion 3, the second vibration portion 5, and the third vibration portion 7 via the relay substrate 20. Therefore, when the second vibration portion 5 and the third vibration portion 7 are used as a temperature detection unit, a temperature of the first vibration portion 3 can be accurately detected.

As shown in FIG. 2, the first vibration portion 3 has the first main surface 16a of the crystal substrate 2 and the second main surface 16b parallel to the first main surface 16a. At the first main surface 16a and the second main surface 16b of the first vibration portion 3, the pair of first excitation electrodes 4 are formed in a manner of sandwiching the first vibration portion 3 in a thickness direction of the crystal substrate 2. The first excitation electrode 4 on a first main surface 16a side and the first excitation electrode 4 on a second main surface 16b side overlap each other in plan view from the Y' direction. The first main surface 16a and the second main surface 16b correspond to two main surfaces.

Figure 4:
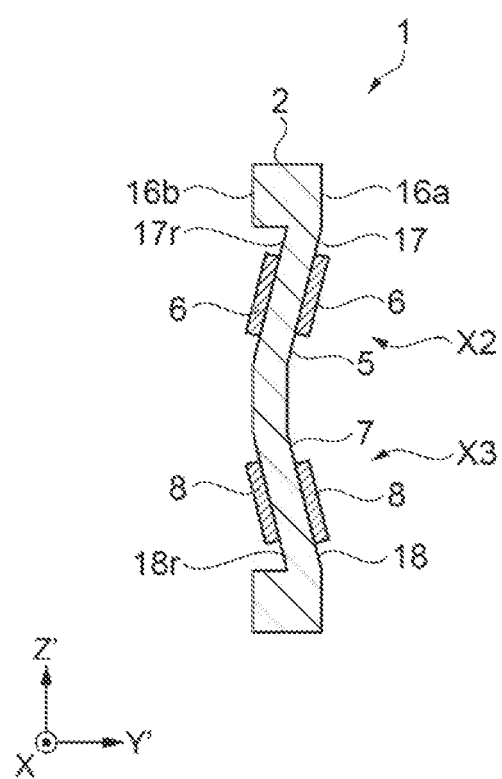
FIG. 4 is a cross-sectional view taken along a line B-B in FIG. 1.

As shown in FIG. 4, the second vibration portion 5 has a first inclined surface 17 inclined at a predetermined inclination angle with respect to the two main surfaces 16a and 16b, and a surface 17r parallel to the first inclined surface 17 on a back side of the first inclined surface 17. At the first inclined surface 17 and the surface 17r of the second vibration portion 5, the pair of second excitation electrodes 6 are formed in a manner of sandwiching the second vibration portion 5 in the thickness direction of the crystal substrate 2. The second excitation electrode 6 on a first inclined surface 17 side and the second excitation electrode 6 on a surface 17r side overlap each other in plan view from the Y' direction.

The first inclined surface 17 is inclined such that a distance from the first main surface 16a increases as the first inclined surface 17 approaches the second inclined surface 18 of the third vibration portion 7.

As shown in FIG. 4, the third vibration portion 7 has a second inclined surface 18 inclined at a predetermined inclination angle with respect to the two main surfaces 16a and 16b and the first inclined surface 17, and a surface 18r parallel to the second inclined surface 18 on a back side of the second inclined surface 18. At the second inclined surface 18 and the surface 18r of the third vibration portion 7, the pair of third excitation electrodes 8 are formed in a manner of sandwiching the third vibration portion 7 in the thickness direction of the crystal substrate 2. The third excitation electrode 8 on a second inclined surface 18 side and the third excitation electrode 8 on a surface 18r side overlap each other in plan view from the Y' direction.

The second inclined surface 18 is inclined such that a distance from the first main surface 16a increases as the second inclined surface 18 approaches the first inclined surface 17 of the second vibration portion 5.

The terminal 10 electrically coupled to, via the lead electrode 13, the first excitation electrode 4 formed at the first vibration portion 3, the terminal 11 electrically coupled to, via the lead electrode 14, the second excitation electrode 6 formed at the second vibration portion 5, and the terminal 12 electrically coupled to, via the lead electrode 15, the third excitation electrode 8 formed at the third vibration portion 7 are formed at the first main surface 16a and the second main surface 16b of the fixing portion 9.

The terminals 10, 11, and 12 that are not coupled to the lead electrodes 13, 14, and 15 are formed at the first main surface 16a and the second main surface 16b of the fixing portion 9. The terminals 10, 11, and 12 that are not coupled to the lead electrodes 13, 14, and 15 and the terminals 10, 11, and 12 that are coupled to the lead electrodes 13, 14, and 15 are electrically coupled via the through electrodes 19, respectively. The terminals 10, 11, and 12 and the through electrodes 19 formed at the second main surface 16b are electrically coupled to, via the bonding members 37a, the coupling terminals 27, 28, and 29 formed at the first main surface 21a of the relay substrate 20, respectively. Specifically, the terminal 10 is fixed to the coupling terminal 27 via the bonding member 37a, the terminal 11 is fixed to the coupling terminal 28 via the bonding member 37a, and the terminal 12 is fixed to the coupling terminal 29 via the bonding member 37a.

In the first vibration element X1, since the pair of first excitation electrodes 4 are formed at the two main surfaces 16a and 16b of the first vibration portion 3, the first vibration portion 3 can be vibrated by applying a voltage to the mounting terminal 35 that is electrically coupled to the internal terminal 34 electrically coupled to the coupling terminal 27 of the relay substrate 20.

In the second vibration element X2, since the pair of second excitation electrodes 6 are formed at the first inclined surface 17 and the surface 17r of the second vibration portion 5 in a manner of sandwiching the second vibration portion 5 in the thickness direction of the crystal substrate 2, the second vibration portion 5 can be vibrated by applying a voltage to the mounting terminal 35 that is electrically coupled to the internal terminal 34 electrically coupled to the coupling terminal 28 of the relay substrate 20.

In the third vibration element X3, since the pair of third excitation electrodes 8 are formed at the second inclined surface 18 and the surface 18r of the third vibration portion 7 in a manner of sandwiching the third vibration portion 7 in the thickness direction of the crystal substrate 2, the third vibration portion 7 can be vibrated by applying a voltage to the mounting terminal 35 that is electrically coupled to the internal terminal 34 electrically coupled to the coupling terminal 29 of the relay substrate 20.

Next, cutting angles of the crystal substrate 2 according to the present embodiment will be described with reference to FIG. 5.

Figure 5:
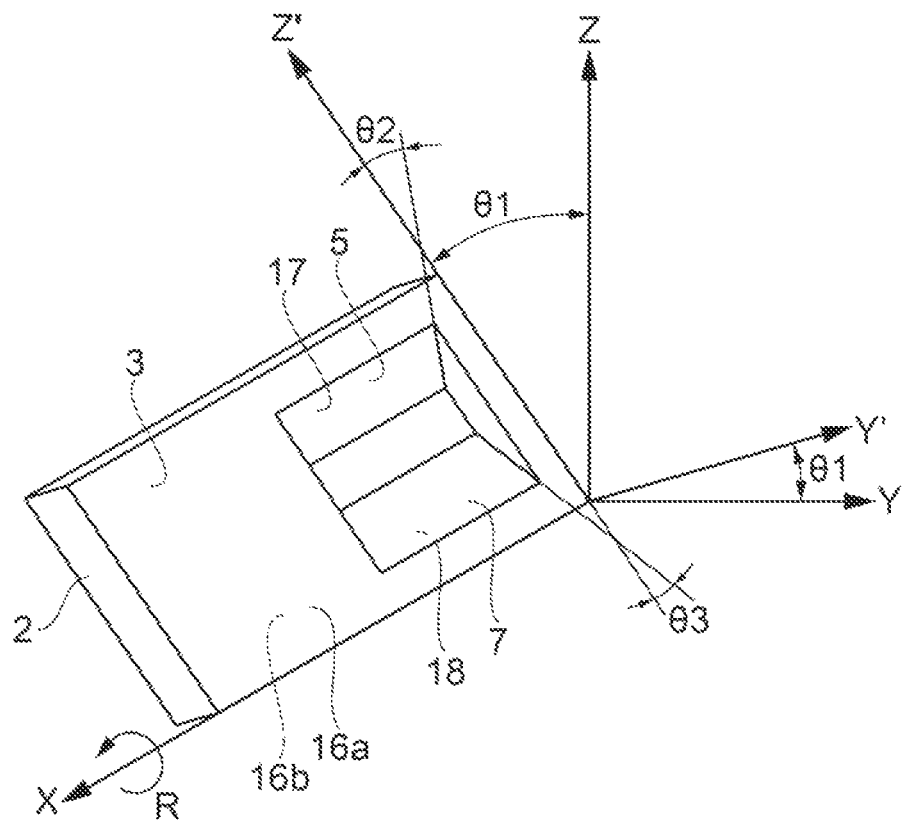
FIG. 5 is a diagram showing cutting angles of a crystal substrate.

In FIG. 5, a direction of an axis or an arrow R is referred to as a "positive direction", and a direction opposite to the arrow is referred to as a "negative direction".

As shown in FIG. 5, a piezoelectric material such as crystal belongs to a three-way crystal system, and has an X axis, a Y axis, and a Z axis that are crystal axes orthogonal to one another. The X axis, the Y axis, and the Z axis are referred to as an electric axis, a mechanical axis, and an optical axis, respectively.

For example, as the piezoelectric substrate, a flat plate made of a so-called rotated Y-cut crystal substrate, which is cut out from crystal along a plane formed by rotating the XZ plane around the X axis by a predetermined angle θ1, is used as the crystal substrate 2. The angle θ1 is also referred to as a cutting angle of the rotated Y-cut crystal substrate.

A rotation direction of rotating the XZ plane around the X axis is indicated by the arrow R. When viewed from the positive direction of the X axis serving as a rotation axis, counterclockwise rotation is defined as positive rotation, and clockwise rotation is defined as negative rotation.

When a coordinate axis in which the Y axis is rotated around the X axis by the angle θ1 is defined as the Y' axis and a coordinate axis in which the Z axis is rotated around the X axis by the angle θ1 is defined as the Z' axis, the rotated Y-cut crystal substrate can be represented by the X axis, the Y' axis, and the Z' axis that are crystal axes orthogonal to one another. In the rotated Y-cut crystal substrate, a thickness direction is the Y' direction, the XZ' plane including the X axis and the Z' axis that are orthogonal to the Y' axis is the main surface, and thickness-shear vibration is excited as main vibration on the main surface.

Here, the rotated Y-cut crystal substrate having the angle θ1 of approximately 35° 15' is called an AT-cut crystal substrate, and has excellent frequency-temperature characteristics. Hereinafter, in the present embodiment, the AT-cut crystal substrate is used as an example of the crystal substrate 2, but the crystal substrate 2 is not limited to the AT-cut crystal substrate, and may be, for example, a crystal substrate such as a BT-cut crystal substrate that excites thickness-shear vibration. When the AT-cut crystal substrate is used as the crystal substrate 2, the angle θ1 may be approximately 35° 15', and for example, the angle θ1 may be 35° 17'.

In the present embodiment, the angle θ1 of the crystal substrate 2 is 35° 15'. Therefore, a cutting angle of the two main surfaces 16a and 16b of the crystal substrate 2 is the angle θ1, that is, 35° 15'.

The first inclined surface 17 of the crystal substrate 2 is inclined by an angle θ2 with respect to the first main surface 16a. That is, since the first inclined surface 17 of the crystal substrate 2 is rotated around the X axis in the negative direction from the Z' axis, a cutting angle of the first inclined surface 17 is θ1−θ2, that is, 35° 15' −θ2.

The second inclined surface 18 of the crystal substrate 2 is inclined by an angle θ3 with respect to the first main surface 16a. That is, since the second inclined surface 18 of the crystal substrate 2 is rotated around the X axis in the positive direction from the Z' axis, a cutting angle of the second inclined surface 18 is θ1+θ3, that is, 35° 15' +θ3.

In the present embodiment, the cutting angle of the first inclined surface 17 is θ1−θ2, the cutting angle of the second inclined surface 18 is θ1+θ3. The cutting angle of the two main surfaces 16a and 16b, the cutting angle of the first inclined surface 17, and the cutting angle of the second inclined surface 18 are different.

The fact that the cutting angle of the first inclined surface 17 and the cutting angle of the second inclined surface 18 are different means that the second inclined surface 18 is inclined with respect to the first inclined surface 17.

Next, relation between the cutting angles of the crystal substrate 2 and frequency-temperature characteristics will be described with reference to FIGS. 6 and 7.

Figure 6:
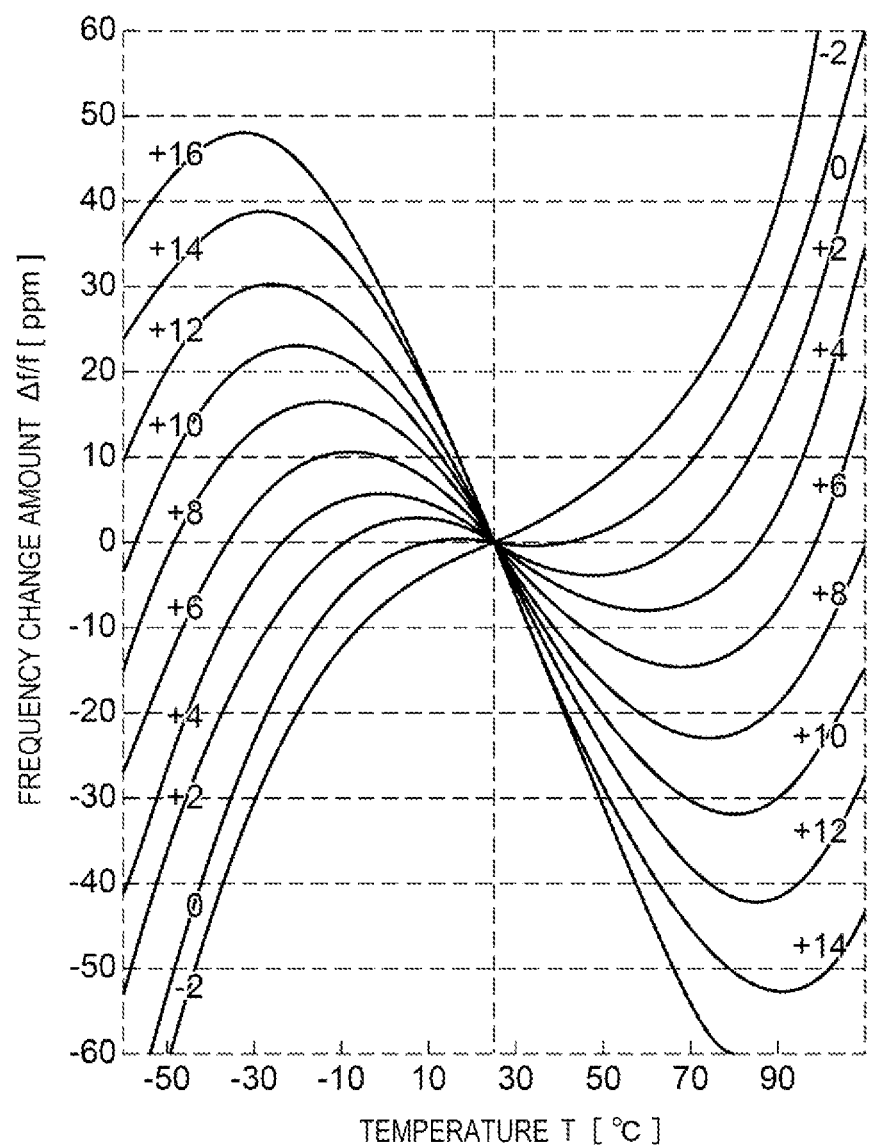
FIG. 6 is a graph showing relation between the cutting angles of the crystal substrate and frequency-temperature characteristics.

FIG. 6 shows the relation between the cutting angles and the frequency-temperature characteristics when the cutting angles are changed at intervals of 2' with reference to the AT-cut crystal substrate having the cutting angle of 35° 15' in the rotated Y-cut crystal substrate. For example, in FIG. 6, a curve indicated by +10 indicates a frequency-temperature characteristic of the rotated Y-cut crystal substrate having a cutting angle of 35° 15'+10', that is, a cutting angle of 35° 25'. As described above, by changing the cutting angle, it is possible to adjust a frequency change amount Δf/f with respect to a temperature change.

In the present embodiment, since the pair of second excitation electrodes 6 that excite the second vibration portion 5 are provided at the first inclined surface 17 and the surface 17r that have the same cutting angle, a frequency-temperature characteristic of the second vibration element X2 according to the present embodiment is a frequency-temperature characteristic corresponding to the cutting angle θ1−θ2=35° 15'−θ2 of the first inclined surface 17, and a frequency change amount Δf/f with respect to a temperature change of the second vibration element X2 is a frequency change amount Δf/f with respect to a temperature change when the cutting angle is 35° 15'−θ2.

Since the pair of third excitation electrodes 8 that excite the third vibration portion 7 are provided at the second inclined surface 18 and the surface 18r that have the same cutting angle, a frequency-temperature characteristic of the third vibration element X3 according to the present embodiment is a frequency-temperature characteristic corresponding to the cutting angle 35° 15'+θ3 of the second inclined surface 18, and a frequency change amount Δf/f with respect to a temperature change of the third vibration element X3 is a frequency change amount Δf/f with respect to a temperature change when the cutting angle is 35° 15'+θ3.

Figure 7:
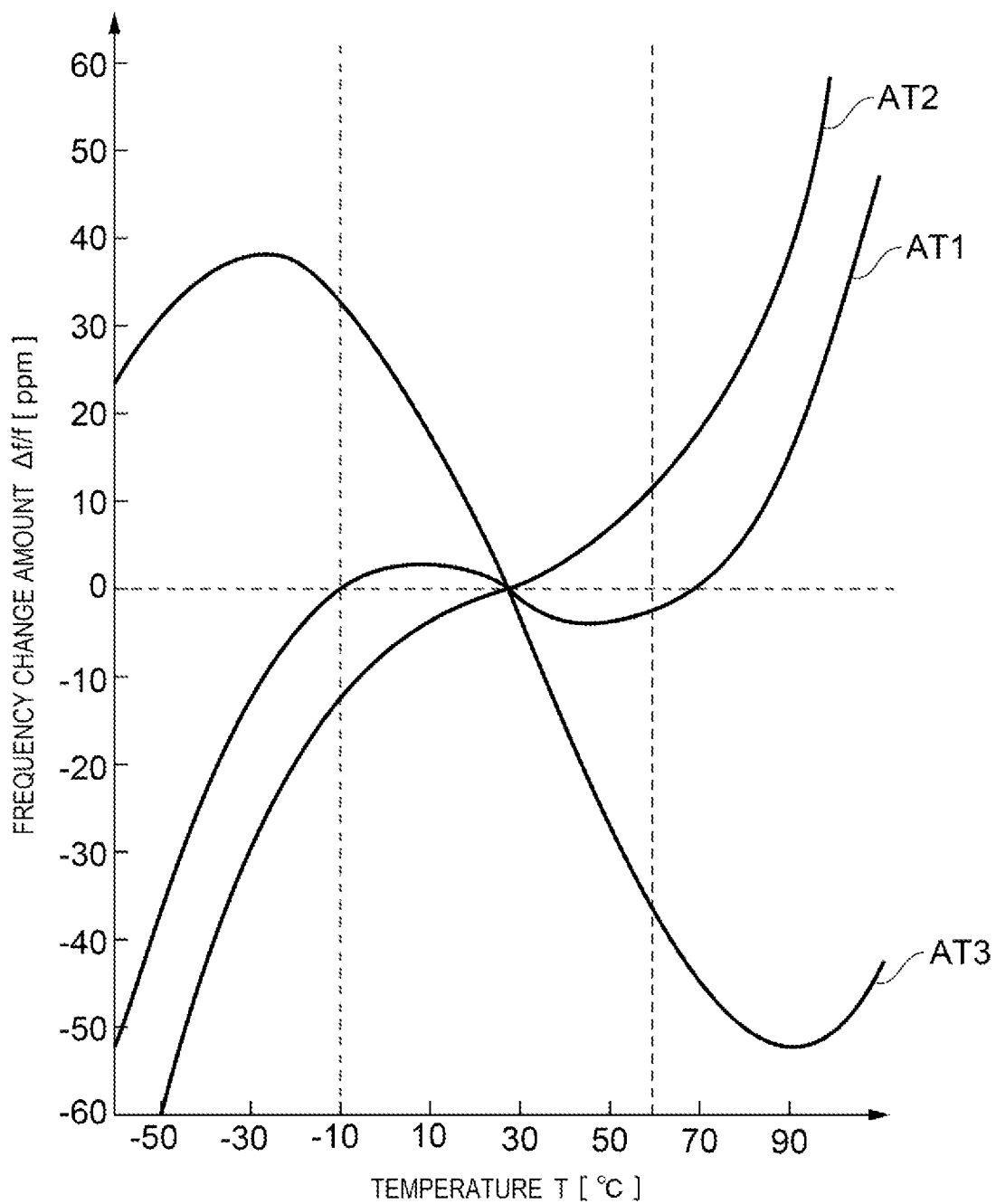
FIG. 7 is a diagram showing an example of frequency-temperature characteristics of a vibration element.

In FIG. 7 showing an example of frequency-temperature characteristics of the vibration element 1 according to the present embodiment, AT1 indicates a frequency-temperature characteristic of the first vibration element X1, AT2 indicates a frequency-temperature characteristic of the second vibration element X2, and AT3 indicates a frequency-temperature characteristic of the third vibration element X3. As shown in FIG. 7, the frequency-temperature characteristic of the first vibration portion 3 of the first vibration element X1, the frequency-temperature characteristic of the second vibration portion 5 of the second vibration element X2, and the frequency-temperature characteristic of the third vibration portion 7 of the third vibration element X3 are different.

Since the angle θ1 of the first vibration portion 3 is 35° 15' and the AT-cut crystal substrate is used as it is, the frequency change amount Δf/f of the first vibration element X1 with respect to the temperature change is small. Therefore, by using the first vibration element X1 for oscillation signal output, it is possible to obtain an oscillation signal that is relatively stable with respect to the temperature change.

By changing the angle θ2 of the first inclined surface 17, it is possible to perform adjustment such that the frequency change amount Δf/f with respect to the temperature change of the second vibration portion 5 is larger than the frequency change amount Δf/f of the first vibration portion 3, and by changing the angle θ3 of the second inclined surface 18, it is possible to perform adjustment such that the frequency change amount Δf/f with respect to the temperature change of the third vibration portion 7 is larger than the frequency change amount Δf/f of the first vibration portion 3. The fact that the frequency change amount Δf/f of the second vibration element X2 and the third vibration element X3 with respect to the temperature change is large means that a resolution of the temperature change with respect to the frequency change is high and that temperature detection can be executed with high accuracy. Therefore, by using the second vibration element X2 and the third vibration element X3 for temperature detection, it is possible to accurately detect a temperature.

In the present embodiment, when the cutting angle of the two main surfaces 16a and 16b is θ1, the cutting angle of the first inclined surface 17 of the second vibration portion 5 is θ1−θ2, that is, 35° 15'−θ2, and the cutting angle of the first inclined surface 17 of the second vibration portion 5 is smaller than the cutting angle θ1 of the two main surfaces 16a and 16b. The cutting angle of the second inclined surface 18 of the third vibration portion 7 is θ1+θ3, that is, 35° 15'+θ3, and is larger than the cutting angle θ1 of the two main surfaces 16a and 16b. By setting the cutting angle of the first inclined surface 17 of the second vibration portion 5 and the cutting angle of the second inclined surface 18 of the third vibration portion 7 to different angles, it is possible to cause the frequency-temperature characteristics of the second vibration element X2 and the third vibration element X3 that are used for temperature detection to be different.

By causing the frequency-temperature characteristics of the second vibration element X2 and the third vibration element X3 that are used for temperature detection to be different, for example, by executing the temperature detection based on the second vibration element X2 in a temperature range in which the resolution of temperature change with respect to the frequency change of the second vibration element X2 is higher than that of the third vibration element X3 and the temperature detection can be executed with high accuracy, and by executing the temperature detection based on the third vibration element X3 in a temperature range in which the resolution of temperature change with respect to the frequency change of the third vibration element X3 is higher than that of the second vibration element X2 and the temperature detection can be executed with high accuracy, it is possible to execute the temperature detection with higher accuracy.

For example, in FIG. 7, in a temperature range in which a temperature T is from −10° C. to 60° C., since the resolution of temperature change with respect to the frequency change of the third vibration element X3 is higher than that of the second vibration element X2, the temperature detection may be executed based on the third vibration element X3. On the other hand, in a temperature range in which the temperature T is lower than −10° C. or higher than 60° C., the resolution of temperature change with respect to the frequency change of the third vibration element X3 is low, and the frequency change of the third vibration element X3 does not show a monotonic increase or a monotonic decrease with respect to the temperature change. Therefore, in the temperature range in which the temperature T is lower than −10° C. or higher than 60° C., the temperature detection may be executed based on the second vibration element X2 whose resolution of temperature change with respect to the frequency change is higher than that of the third vibration element X3.

The temperature range in which the second vibration element X2 is used for the temperature detection and the temperature range in which the third vibration element X3 is used for the temperature detection are not limited to the above-described temperature ranges, and can be freely set based on frequency-temperature characteristics of the second vibration portion 5 and the third vibration portion 7.

Since the first vibration element X1, the second vibration element X2, and the third vibration element X3 are formed at the common crystal substrate 2, heat transfer between the first vibration element X1 and the second vibration element X2, heat transfer between the first vibration element X1 and the third vibration element X3, and heat transfer between the second vibration element X2 and the third vibration element X3 are quickly performed. Therefore, since the temperature of the first vibration element X1 can be quickly and accurately detected by the second vibration element X2 and the third vibration element X3 that are used for temperature detection, it is possible to quickly and accurately perform temperature compensation to the first vibration element X1.

In a case in which the AT-cut crystal substrate is used as the crystal substrate 2, in the first inclined surface 17 of the crystal substrate 2 and the second inclined surface 18 of the crystal substrate 2, when the cutting angle of the inclined surface having the larger cutting angle is θa and the cutting angle of the other inclined surface is θb, a range of the cutting angle θb may be θa−1° or more and θa−20° or less. When the cutting angle θb is θa−1° or more, a difference between the cutting angle of the first inclined surface 17 of the crystal substrate 2 and the cutting angle of the second inclined surface 18 of the crystal substrate 2 is sufficiently large. Therefore, it is possible to cause the frequency-temperature characteristics of the second vibration element X2 and the third vibration element X3 that are used for temperature detection to be sufficiently different, and to execute the temperature detection with high accuracy. Therefore, the cutting angle θb is preferably θa−1° or more. When the cutting angle θb is set to be larger, it is difficult to form the inclined surface, and thus the cutting angle θb is preferably θa−20° or less. In the present embodiment, the cutting angle θ1−θ2 of the first inclined surface 17 corresponds to θb, and the cutting angle θ1+θ3 of the second inclined surface 18 corresponds to θa.

As described above, in the vibrator 100 according to the present embodiment, a central portion between the first vibration portion 3 of the vibration element 1 and the second and third vibration portions 5 and 7 is fixed to the central portion sandwiched between both the end portions of the relay substrate 20, and both the end portions of the relay substrate 20 are fixed to the package 30. Therefore, heat from the outside of the package 30 is less likely to be transferred, and the transferred heat is uniformly transferred from a central portion of the vibration element 1 to the first vibration portion 3, the second vibration portion 5, and the third vibration portion 7. Therefore, a temperature difference between the first vibration portion 3 and the second and third vibration portions 5 and 7 is small, and when the first vibration portion 3 is used for oscillation signal output and the second vibration portion 5 and the third vibration portion 7 are used for temperature detection, it is possible to accurately detect the temperature of the first vibration portion 3.

By setting the first vibration portion 3 to a cutting angle at which the frequency change amount of the frequency-temperature characteristic is small and setting the first inclined surface 17 of the second vibration portion 5 and the second inclined surface 18 of the third vibration portion 7 to a cutting angle at which the frequency change amount of the frequency-temperature characteristic is large, the second vibration portion 5 and the third vibration portion 7 can be used for temperature detection in which a resolution of the temperature change is high and accurate temperature detection can be executed.

1.2. Method for Manufacturing Vibration Element

A method for manufacturing the vibration element 1 will be described with reference to FIGS. 8 to 13.

The method for manufacturing the vibration element 1 includes a crystal substrate preparing step, a resist coating step, a dry etching step, a separating step, and an electrode forming step.

1.2.1. Crystal Substrate Preparing Step

Figure 8:
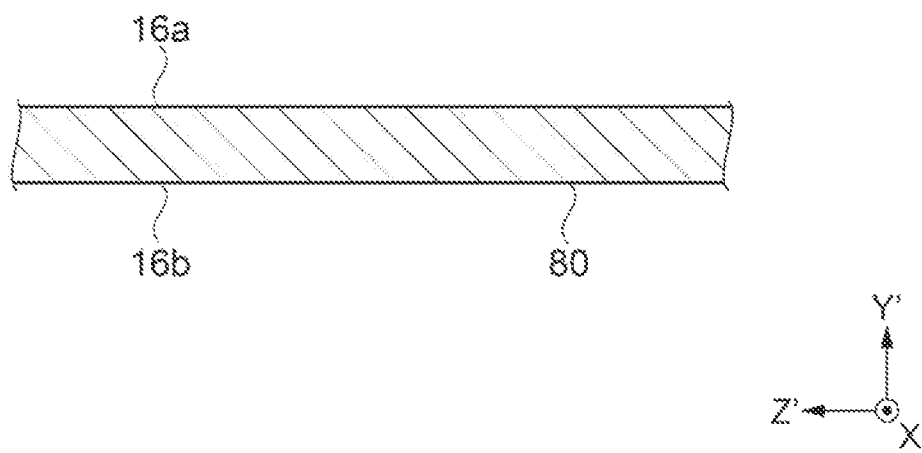
FIG. 8 is a schematic cross-sectional view showing a manufacturing step of the vibration element.

As shown in FIG. 8, in consideration of mass productivity and manufacturing costs of the vibration elements 1, a large crystal substrate 80 that can manufacture a plurality of vibration elements 1 according to a batch processing method is prepared. The large crystal substrate 80 has a desired thickness formed by cutting a crystal raw material at a predetermined cutting angle θ1 and performing lapping, polishing, and the like. In the present embodiment, the cutting angle θ1 is 35° 15'.

1.2.2. Resist Coating Step

Figure 9:
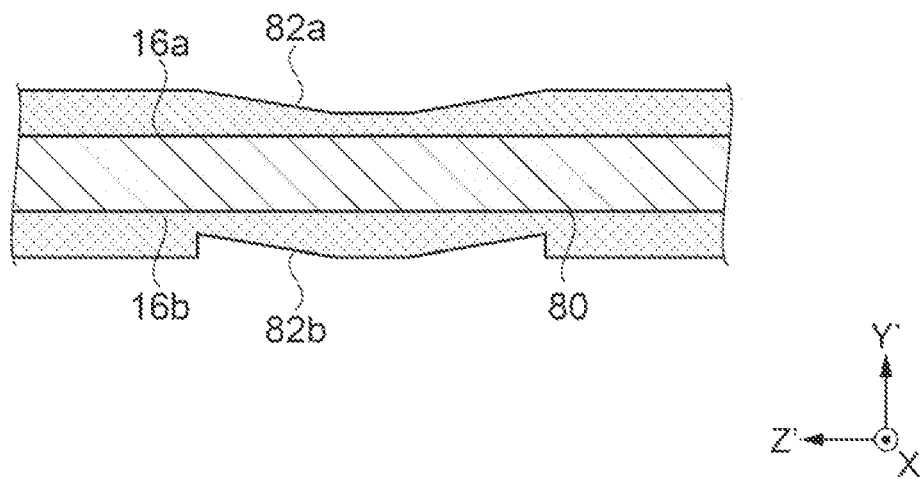
FIG. 9 is a schematic cross-sectional view showing a manufacturing step of the vibration element.

As shown in FIG. 9, the two main surfaces 16a and 16b of the large crystal substrate 80 are coated with resists 82a and 82b. Here, in a method for coating the first main surface 16a with the resist 82a, a mold having a recess corresponding to a shape of the first inclined surface 17 to be formed with the second excitation electrode 6 and a shape of the second inclined surface 18 to be formed with the third excitation electrode 8 is filled, and the resist 82a with which the mold is filled is transferred to the first main surface 16a and cured. In a method for coating the second main surface 16b with the resist 82b, a mold having a convex portion corresponding to a shape of the surface 17r to be formed with the second excitation electrode 6 and a shape of the surface 18r to be formed with the third excitation electrode 8 is filled, and the resist 82b with which the mold is filled is transferred to the second main surface 16b and cured.

1.2.3. Dry Etching Step

Figure 10:
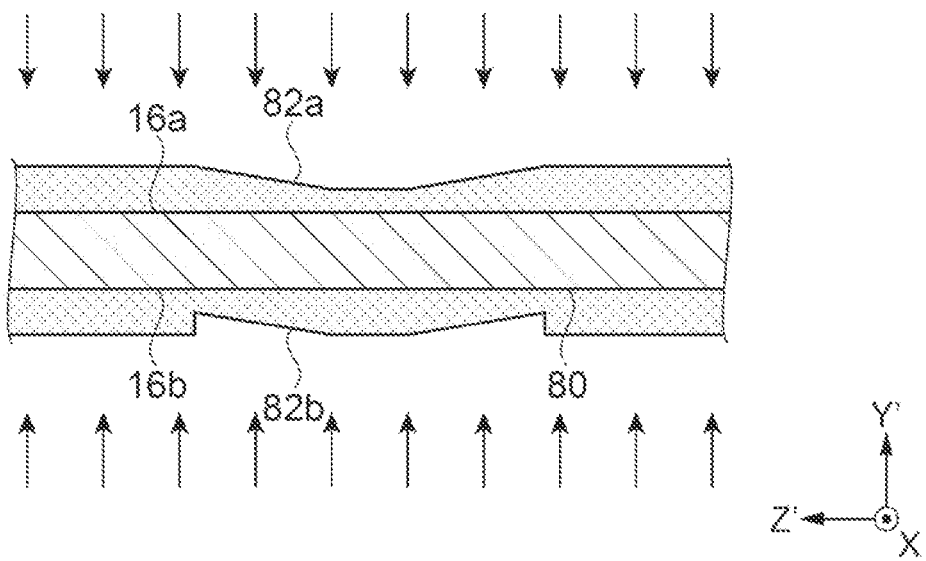
FIG. 10 is a schematic cross-sectional view showing a manufacturing step of the vibration element.

Next, as indicated by arrows in FIG. 10, dry etching is performed from above each of the two main surfaces 16a and 16b using a plasma etching apparatus or the like according to a dry etching method.

Figure 11:
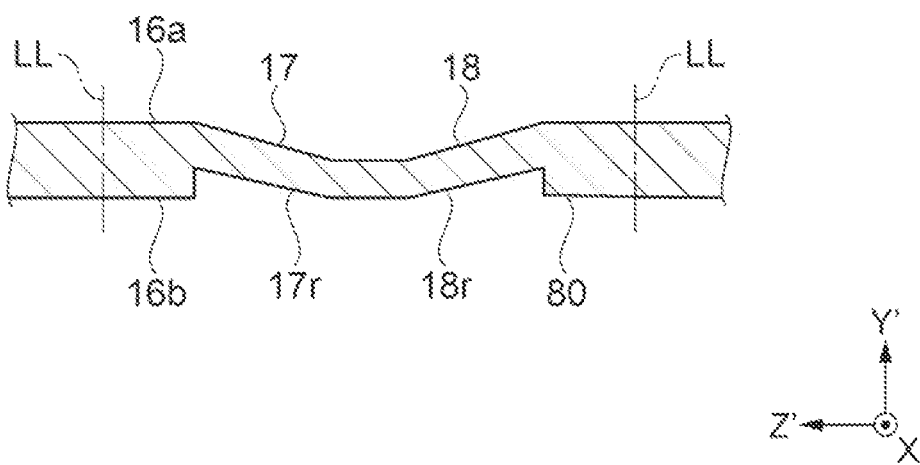
FIG. 11 is a schematic cross-sectional view showing a manufacturing step of the vibration element.

FIG. 11 shows a state in which the resists 82a and 82b are removed by the dry etching. The shapes of the resists 82a and 82b, which are formed as shown in FIG. 9, corresponding to the shapes of the inclined surfaces on the two main surfaces 16a and 16b are transferred to the large crystal substrate 80 as they are and thinned. Accordingly, the first inclined surface 17, the surface 17r, the second inclined surface 18, and the surface 18r are formed at the large crystal substrate 80.

1.2.4. Separating Step

Figure 12:
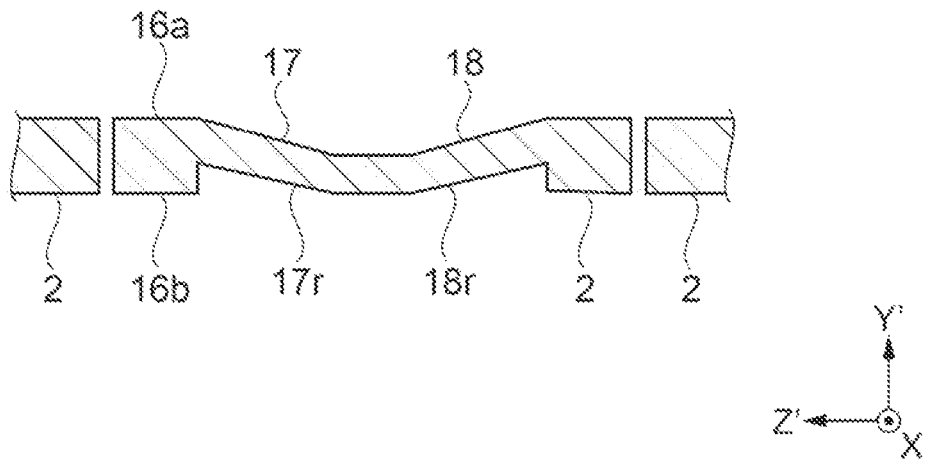
FIG. 12 is a schematic cross-sectional view showing a manufacturing step of the vibration element.

In FIG. 11, since a plurality of crystal pieces are coupled to the large crystal substrate 80, the large crystal substrate 80 is separated. The large crystal substrate 80 is separated by dicing or wet etching using a virtual line LL in FIG. 11 as a reference. FIG. 12 shows the crystal substrate 2 obtained by the separation.

1.2.5. Electrode Forming Step

Figure 13:
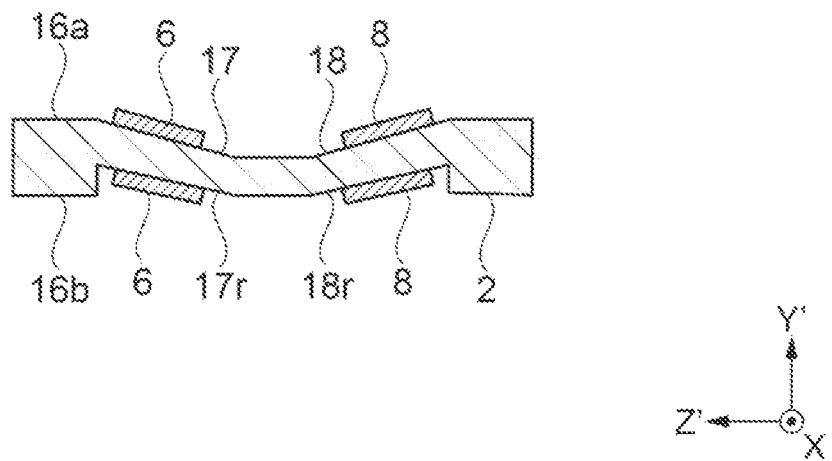
FIG. 13 is a schematic cross-sectional view showing a manufacturing step of the vibration element.

As shown in FIG. 13, the first excitation electrode 4, the second excitation electrode 6, the third excitation electrode 8, and the like are formed at the crystal substrate 2 obtained by the separation by vapor deposition or sputtering to form the vibration element 1.

The first inclined surface 17, the surface 17r, the second inclined surface 18, and the surface 18r may be formed according to a method other than the method described above. For example, as a method for forming the partially thinned resists 82a and 82b, a method of using gray scale exposure in which the resists 82a and 82b are exposed under conditions of different light amount distributions may be used.

A method for forming the vibration element 1 may be used in which the first excitation electrode 4, the second excitation electrode 6, the third excitation electrode 8, and the like are collectively formed at the large crystal substrate 80 before the large crystal substrate 80 is separated, and then the large crystal substrate 80 is separated.

The first vibration element X1, the second vibration element X2, and the third vibration element X3 are formed at the common crystal substrate 2, and heat transfer among the first vibration element X1, the second vibration element X2, and the third vibration element X3 is quickly performed. Since the first inclined surface 17, the surface 17r, the second inclined surface 18, and the surface 18r can be formed according to a manufacturing method in which load on the crystal substrate 2 is small, such as a dry etching method, mechanical strength of the crystal substrate 2 is less likely to decrease or the crystal substrate 2 is less likely to deteriorate over time.

2. Second Embodiment

A schematic configuration of a vibration element 1a according to a second embodiment will be described with reference to FIGS. 14 and 15. The same configurations as those according to the first embodiment are denoted by the same reference numerals, and redundant description thereof will be omitted.

Figure 14:
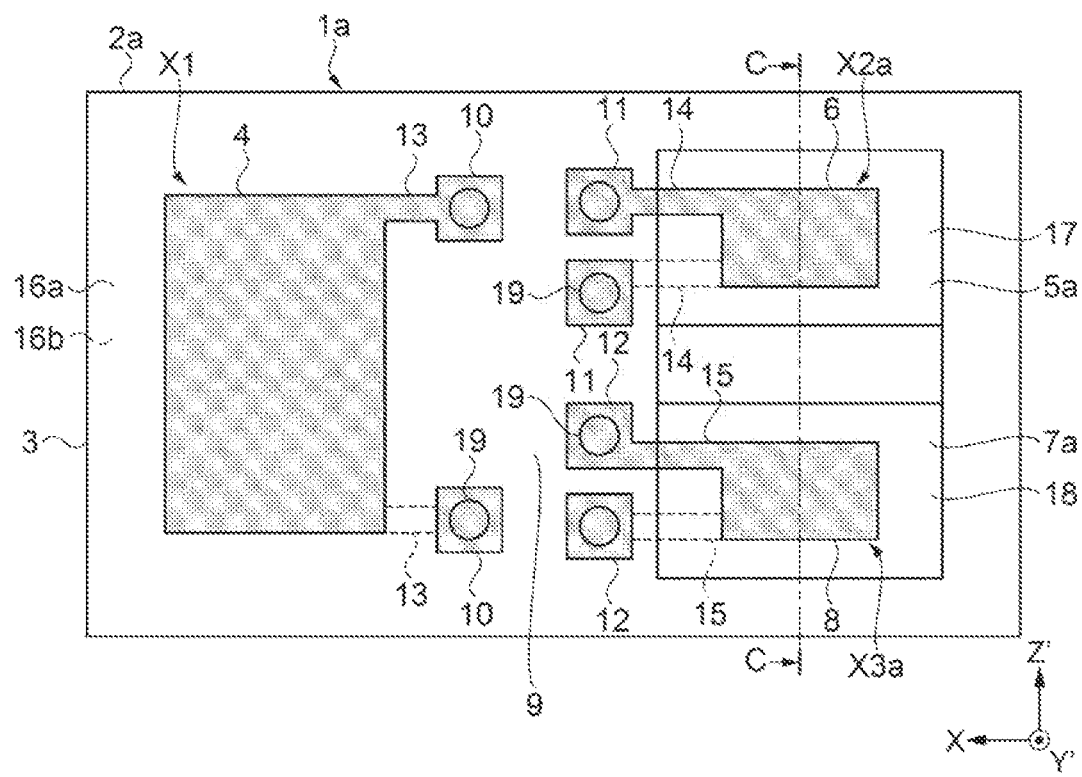
FIG. 14 is a plan view showing a vibration element according to a second embodiment.
Figure 15:
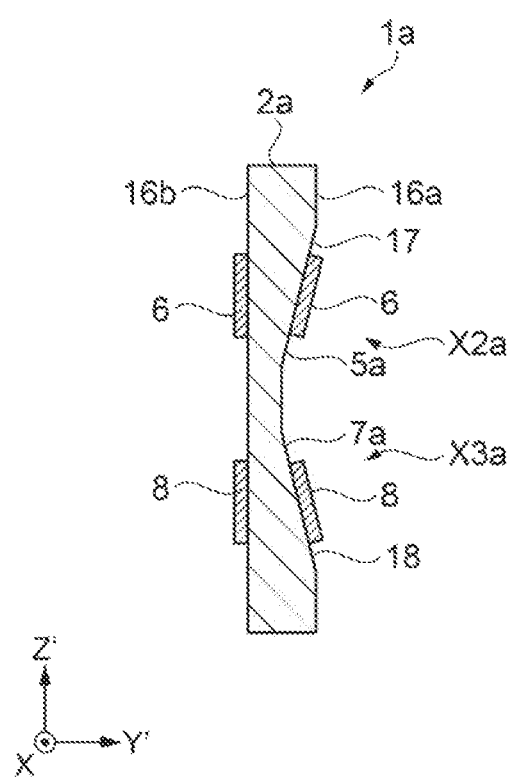
FIG. 15 is a cross-sectional view taken along a line C-C in FIG. 14.

As shown in FIGS. 14 and 15, in a crystal substrate 2a according to the present embodiment, the first inclined surface 17 formed at a second vibration portion 5a and the second inclined surface 18 formed at a third vibration portion 7a are inclined such that thicknesses of the second vibration portion 5a and the third vibration portion 7a become thinner as the first inclined surface 17 and the second inclined surface 18 approach each other.

The second vibration portion 5a includes the first inclined surface 17 and the second main surface 16b. The first inclined surface 17 is an inclined surface inclined at a predetermined inclination angle with respect to the two main surfaces 16a and 16b.

The third vibration portion 7a has the second inclined surface 18 and the second main surface 16b. The second inclined surface 18 is an inclined surface inclined at a predetermined inclination angle with respect to the two main surfaces 16a and 16b and the first inclined surface 17.

The first inclined surface 17 of the crystal substrate 2a is rotated around the X axis by an angle θ2 from the Z' axis in the negative direction. Therefore, a cutting angle of the first inclined surface 17 is θ1−θ2, that is, 35° 15'−θ2 when the cutting angle of the second main surface 16b is θ1. A cutting angle of the second vibration portion 5a is θ1−θ2/2, that is, 35° 15'−θ2/2, and is smaller than the cutting angle θ1 of the second main surface 16b. The second inclined surface 18 of the crystal substrate 2a is rotated around the X axis by an angle θ3 from the Z' axis in the positive direction. A cutting angle of the second inclined surface 18 is θ1+θ3, that is, 35° 15'+θ3. A cutting angle of the third vibration portion 7a is θ1+θ3/2, that is, 35° 15'+θ3/2, and is larger than the cutting angle θ1 of the second main surface 16b.

According to the present embodiment, frequency-temperature characteristics of a second vibration element X2a including the second vibration portion 5a and a third vibration element X3a including the third vibration portion 7a can have a larger frequency change amount than the frequency-temperature characteristic of the first vibration portion 3. Therefore, when the second vibration element X2a and the third vibration element X3a are used for temperature detection, the second vibration element X2a and the third vibration element X3a have a high resolution of the temperature change with respect to the frequency change and can perform temperature detection with high accuracy, and the same effect as that according to the first embodiment can be attained.

3. Third Embodiment

A schematic configuration of a vibration element 1b according to a third embodiment will be described with reference to FIGS. 16 and 17. The same configurations as those according to the first embodiment are denoted by the same reference numerals, and redundant description thereof will be omitted.

Figure 16:
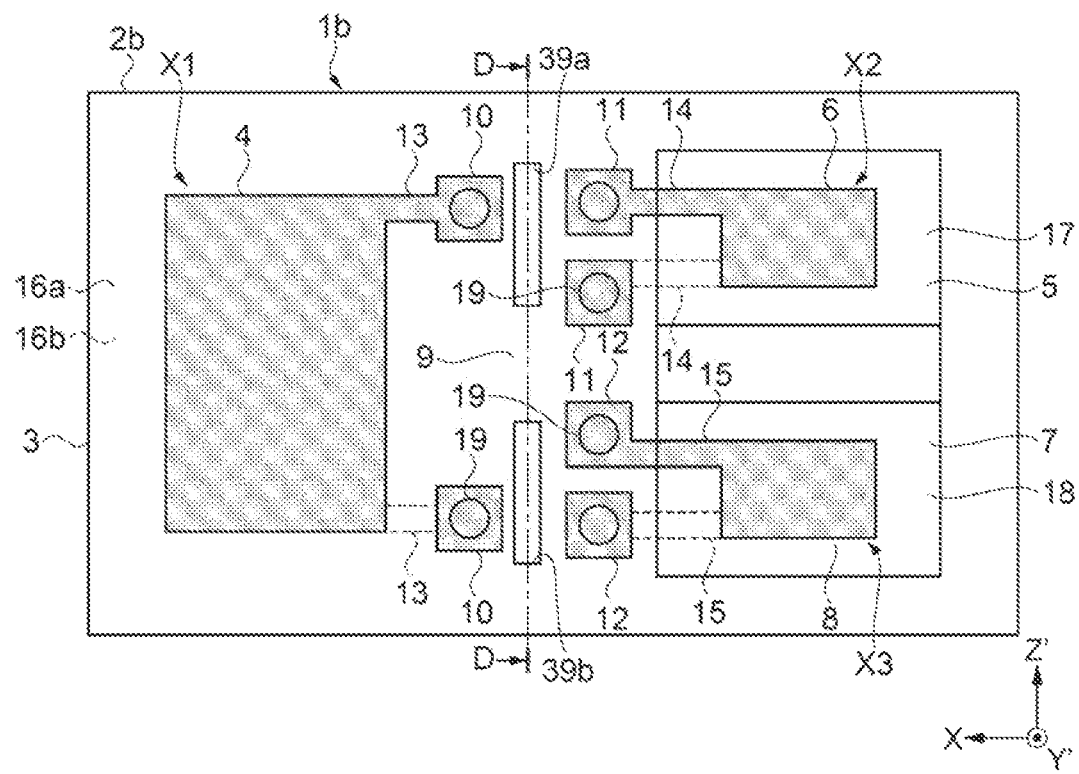
FIG. 16 is a plan view showing a vibration element according to a third embodiment.
Figure 17:
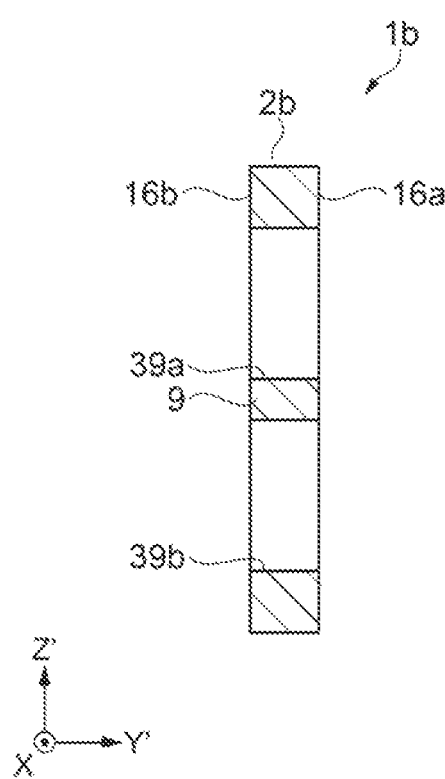
FIG. 17 is a cross-sectional view taken along a line D-D in FIG. 16.

As shown in FIGS. 16 and 17, in a crystal substrate 2b according to the present embodiment, two through holes 39a and 39b whose longitudinal direction is the Z' direction are formed between the first vibration portion 3 and the second and third vibration portions 5 and 7. The through hole 39a is formed between the first vibration portion 3 and the second vibration portion 5, and the through hole 39b is formed between the first vibration portion 3 and the third vibration portion 7.

According to the present embodiment, the following effect can be attained in addition to the effects according to the first embodiment.

Since the through hole 39a is formed between the first vibration portion 3 and the second vibration portion 5, and the through hole 39b is formed between the first vibration portion 3 and the third vibration portion 7, it is possible to prevent a mutual influence between vibration of the first vibration portion 3 and vibration of the second and third vibration portions 5 and 7.

A recessed portion opening on a first main surface 16a side or a recessed portion opening on a second main surface 16b side may be formed at a position where the through holes 39a and 39b are formed.

4. Fourth Embodiment

A schematic configuration of a vibration element 1c according to a fourth embodiment will be described with reference to FIGS. 18 and 19. The same configurations as those according to the first embodiment are denoted by the same reference numerals, and redundant description thereof will be omitted.

Figure 18:
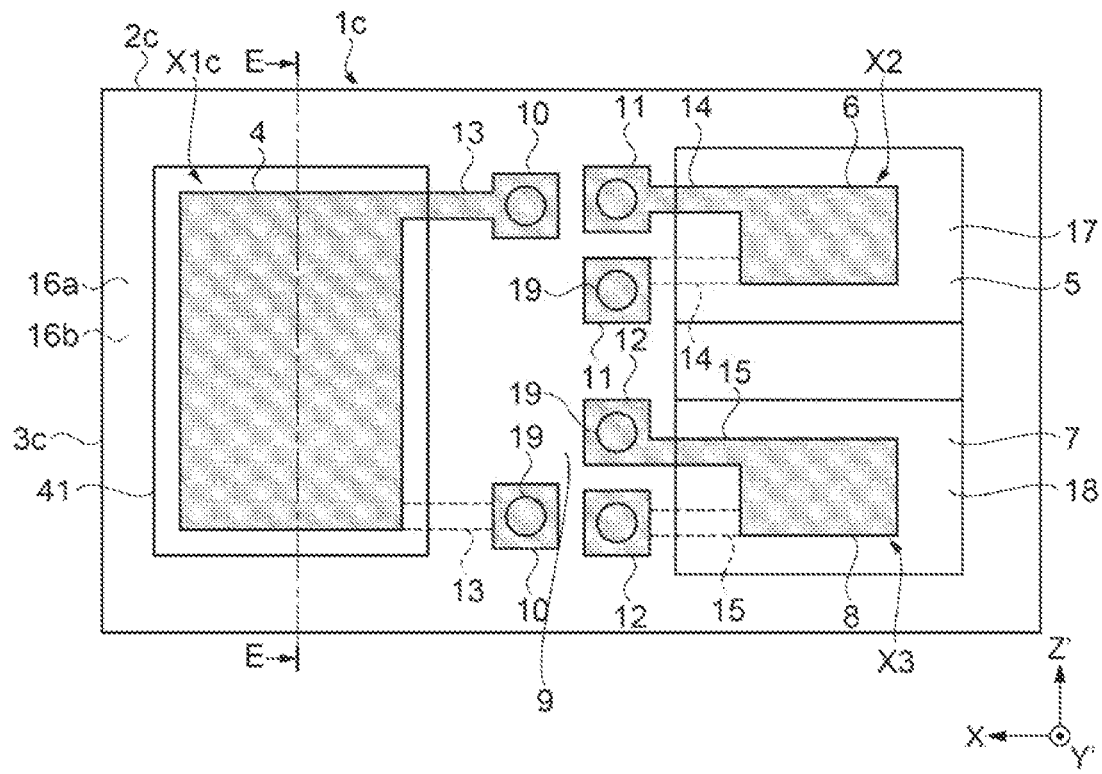
FIG. 18 is a plan view showing a vibration element according to a fourth embodiment.
Figure 19:
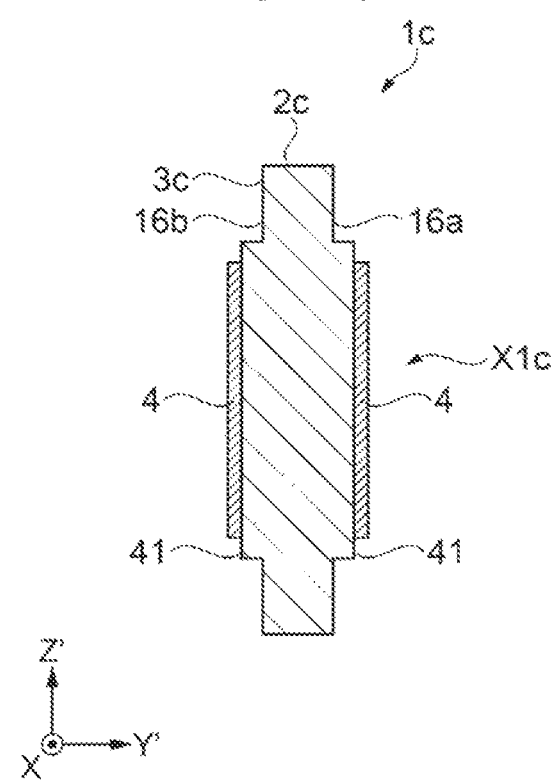
FIG. 19 is a cross-sectional view taken along a line E-E in FIG. 18.

As shown in FIGS. 18 and 19, in a crystal substrate 2c according to the present embodiment, convex portions 41 are formed at the two main surfaces 16a and 16b of the first vibration portion 3c. The pair of first excitation electrodes 4 are formed at the first vibration portion 3c having the convex portions 41 in a manner of sandwiching the first vibration portion 3c in a thickness direction of the crystal substrate 2c.

According to the present embodiment, the following effects can be attained in addition to the effects according to the first embodiment.

Since the first vibration element X1c excites a region including the convex portions 41 of the first vibration portion 3c by the first excitation electrode 4, vibration energy of the first vibration portion 3c can be confined in the region including the convex portions 41, leakage of vibration to a region other than the region including the convex portions 41 can be reduced, and vibration of the first vibration element X1c is stabilized. Since impedance of the first vibration element X1c can be reduced and a Q value of the first vibration element X1c also increases, when such a first vibration element X1c is used as an oscillator, a high-precision oscillator having a good carrier-to-noise ratio can be implemented.

In the present embodiment, although the convex portions 41 are formed at the two main surfaces 16a and 16b of the first vibration portion 3c, the convex portions 41 may be formed at one of the two main surfaces 16a and 16b of the first vibration portion 3c.

In the present embodiment, although the convex portion 41 has a mesa shape protruding in the Y' direction from the two main surfaces 16a and 16b of the first vibration portion 3c, the convex portion 41 may have a spherical shape.

5. Fifth Embodiment

A schematic configuration of a vibration element 1d according to a fifth embodiment will be described with reference to FIGS. 20 and 21. The same configurations as those according to the first embodiment are denoted by the same reference numerals, and redundant description thereof will be omitted.

Figure 20:
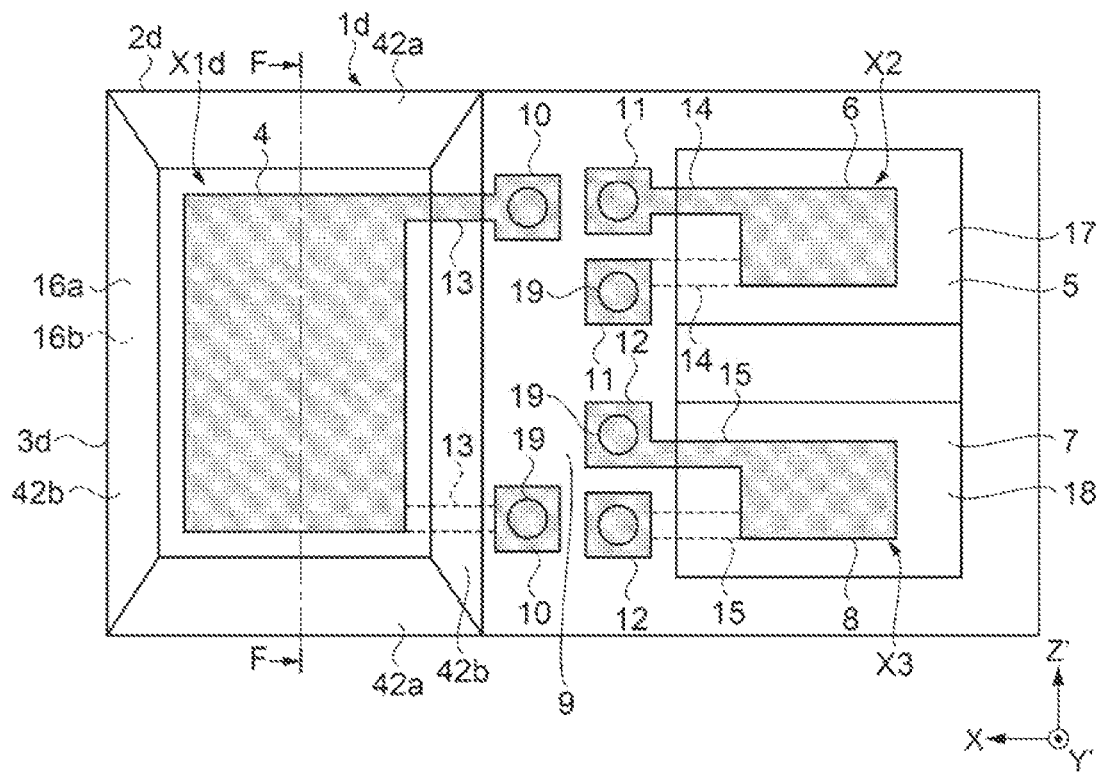
FIG. 20 is a plan view showing a vibration element according to a fifth embodiment.
Figure 21:
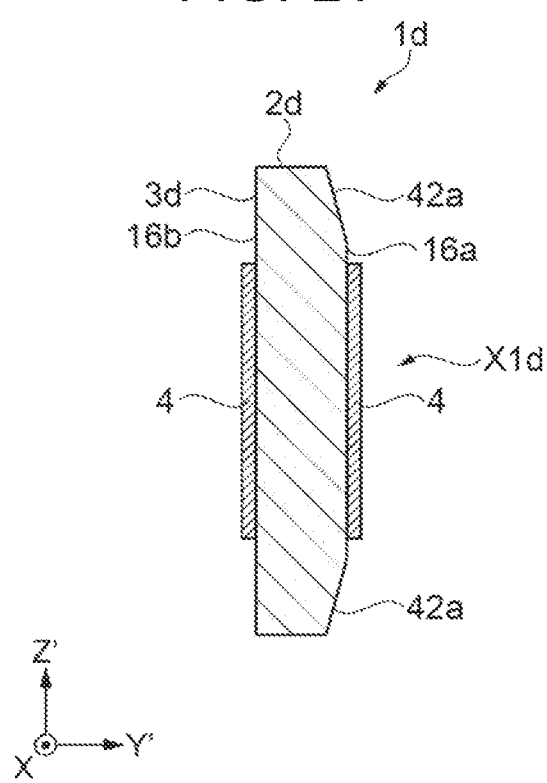
FIG. 21 is a cross-sectional view taken along a line F-F in FIG. 20.

As shown in FIGS. 20 and 21, in a crystal substrate 2d according to the present embodiment, inclined portions 42a and 42b are formed at the first main surface 16a of the first vibration portion 3d. The inclined portions 42a and 42b are inclined such that a thickness of the crystal substrate 2 becomes thinner from a first excitation electrode 4 side toward an outer edge side of the crystal substrate 2d.

According to the present embodiment, the following effects can be attained in addition to the effects according to the first embodiment.

In the first vibration element X1d, the inclined portions 42a and 42b, which are inclined such that the thickness of the crystal substrate 2 becomes thinner toward the outer edge side of the crystal substrate 2d, are formed in a periphery of the first excitation electrode 4. Therefore, vibration energy of the first vibration portion 3d can be confined in a vicinity of the first excitation electrode 4, and a leakage of vibration to the inclined portions 42a and 42b can be reduced. Therefore, since impedance of the first vibration element X1d can be reduced and a Q value of the first vibration element X1d also increases, when such a first vibration element X1d is used as an oscillator, a high-precision oscillator having a good carrier-to-noise ratio can be implemented.

In the present embodiment, although the inclined portions 42a and 42b are formed only at the first main surface 16a of the first vibration portion 3d, the inclined portions 42a and 42b may be formed at the two main surfaces 16a and 16b of the first vibration portion 3d.

6. Sixth Embodiment

Figure 22:
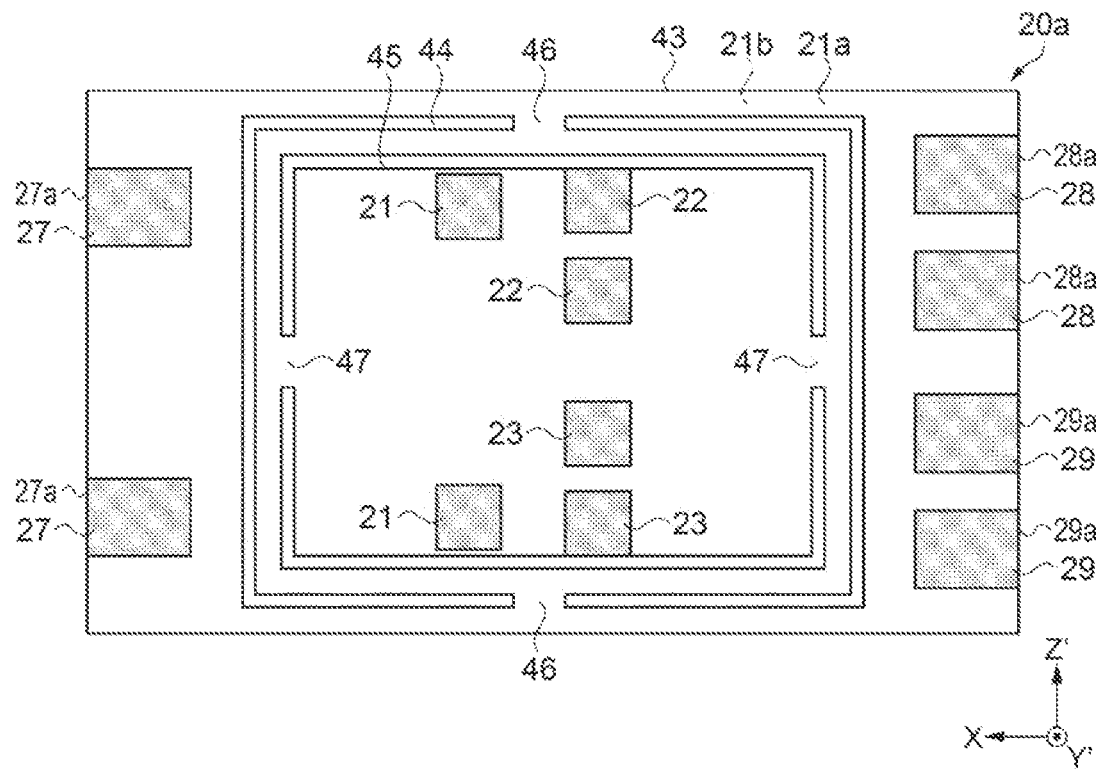
FIG. 22 is a plan view showing a relay substrate according to a sixth embodiment.

A schematic configuration of a relay substrate 20a according to a sixth embodiment will be described with reference to FIG. 22. The same configurations as those according to the first embodiment are denoted by the same reference numerals, and redundant description thereof will be omitted. In FIG. 22, illustration of the coupling electrodes 24, 25, and 26 that electrically couple the fixing terminals 21, 22, and 23 and the coupling terminals 27, 28, and 29 is omitted.

As shown in FIG. 22, the relay substrate 20a according to the present embodiment includes a frame-shaped first frame portion 43 to be fixed to the package 30, a frame-shaped second frame portion 44 provided inside the first frame portion 43, a vibration element support portion 45 that is provided inside the second frame portion 44 and to which the vibration element 1 is to be fixed, a first beam portion 46 that extends along the Z' direction and that couples the first frame portion 43 and the second frame portion 44, and a second beam portion 47 that extends along the X direction and that couples the second frame portion 44 and the vibration element support portion 45.

According to the present embodiment, the following effects can be attained in addition to the effects according to the first embodiment.

According to the relay substrate 20a in which the first frame portion 43 and the second frame portion 44 are coupled by the first beam portion 46 and the second frame portion 44 and the vibration element support portion 45 are coupled by the second beam portion 47, it is possible to lengthen a path through which heat outside the package 30 is transmitted from the coupling terminals 27, 28, and 29 fixed to the package 30 to the vibration element 1, and it is possible that the heat outside the package 30 is less likely to be transmitted to the vibration element 1. It is possible that mounting distortion generated when the relay substrate 20a is fixed to the package 30 is less likely to be transmitted to the vibration element 1.

7. Seventh Embodiment

Figure 23:
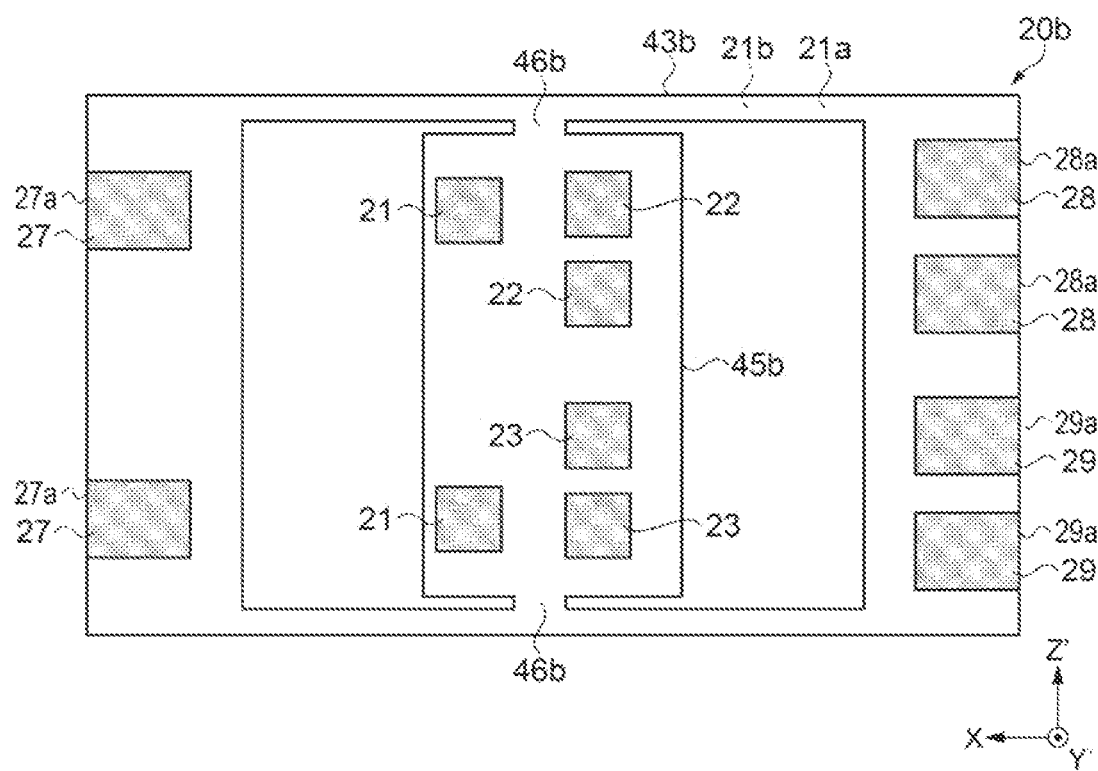
FIG. 23 is a plan view showing a relay substrate according to a seventh embodiment.

A schematic configuration of a relay substrate 20b according to a seventh embodiment will be described with reference to FIG. 23. The same configurations as those according to the first embodiment are denoted by the same reference numerals, and redundant description thereof will be omitted. In FIG. 23, illustration of the coupling electrodes 24, 25, and 26 that electrically couple the fixing terminals 21, 22, and 23 and the coupling terminals 27, 28, and 29 is omitted.

As shown in FIG. 23, the relay substrate 20b according to the present embodiment includes a frame-shaped first frame portion 43b to be fixed to the package 30, a vibration element support portion 45b that is provided inside the first frame portion 43b and to which the vibration element 1 is to be fixed, and a first beam portion 46b that extends along the Z' direction and that couples the first frame portion 43b and the vibration element support portion 45b.

According to the present embodiment, the following effects can be attained in addition to the effects according to the first embodiment.

According to the relay substrate 20b in which the first frame portion 43b and the vibration element support portion 45b are coupled by the first beam portion 46b, it is possible to lengthen a path through which heat outside the package 30 is transmitted from the coupling terminals 27, 28, and 29 fixed to the package 30 to the vibration element 1, and it is possible that the heat outside the package 30 is less likely to be transmitted to the vibration element 1. It is possible that mounting distortion generated when the relay substrate 20b is fixed to the package 30 is less likely to be transmitted to the vibration element 1.

8. Eighth Embodiment

A schematic configuration of an oscillator 200 according to an eighth embodiment will be described with reference to FIGS. 24 and 25. In the oscillator 200 according to the eighth embodiment, although a vibrator including any of the above-described vibration elements 1, 1a, 1b, 1c, and 1d and the relay substrates 20, 20a, and 20b can be used, an example will be described below in which the vibrator 100 including the vibration element 1 and the relay substrate 20 described in the first embodiment is applied.

Figure 24:
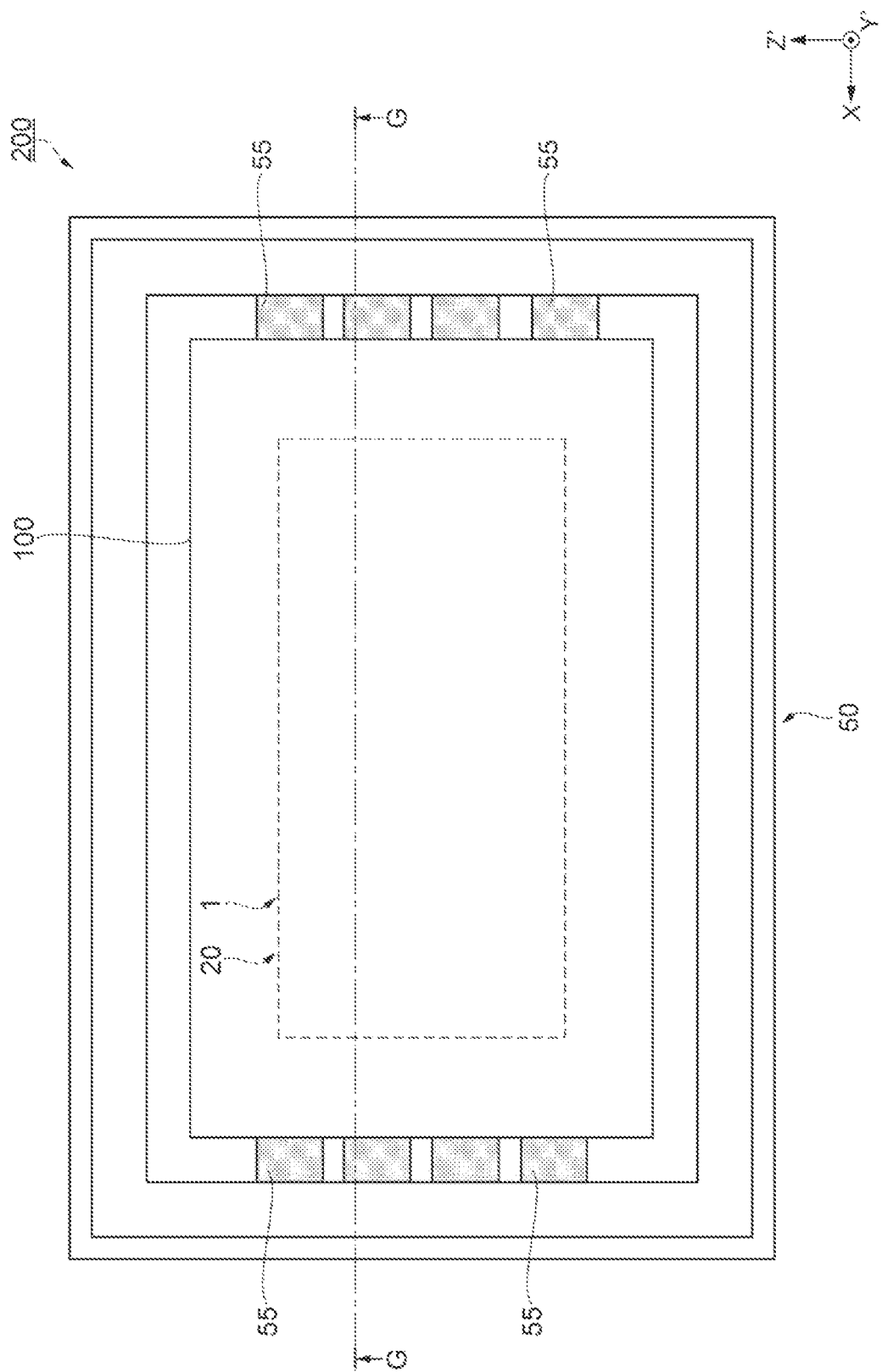
FIG. 24 is a plan view showing an oscillator according to an eighth embodiment.

As shown in FIG. 24, the oscillator 200 includes the vibrator 100 incorporating the vibrator element 1 and the relay substrate 20, an IC chip 60 including oscillation circuits 61a, 61b, and 61c (see FIG. 26) that drive the vibrator element 1 and a control signal output circuit 63 (see FIG. 26), a package 50 that houses the vibrator 100 and the IC chip 60, and a lid member 58 made of glass, ceramic, metal, or the like.

Figure 25:
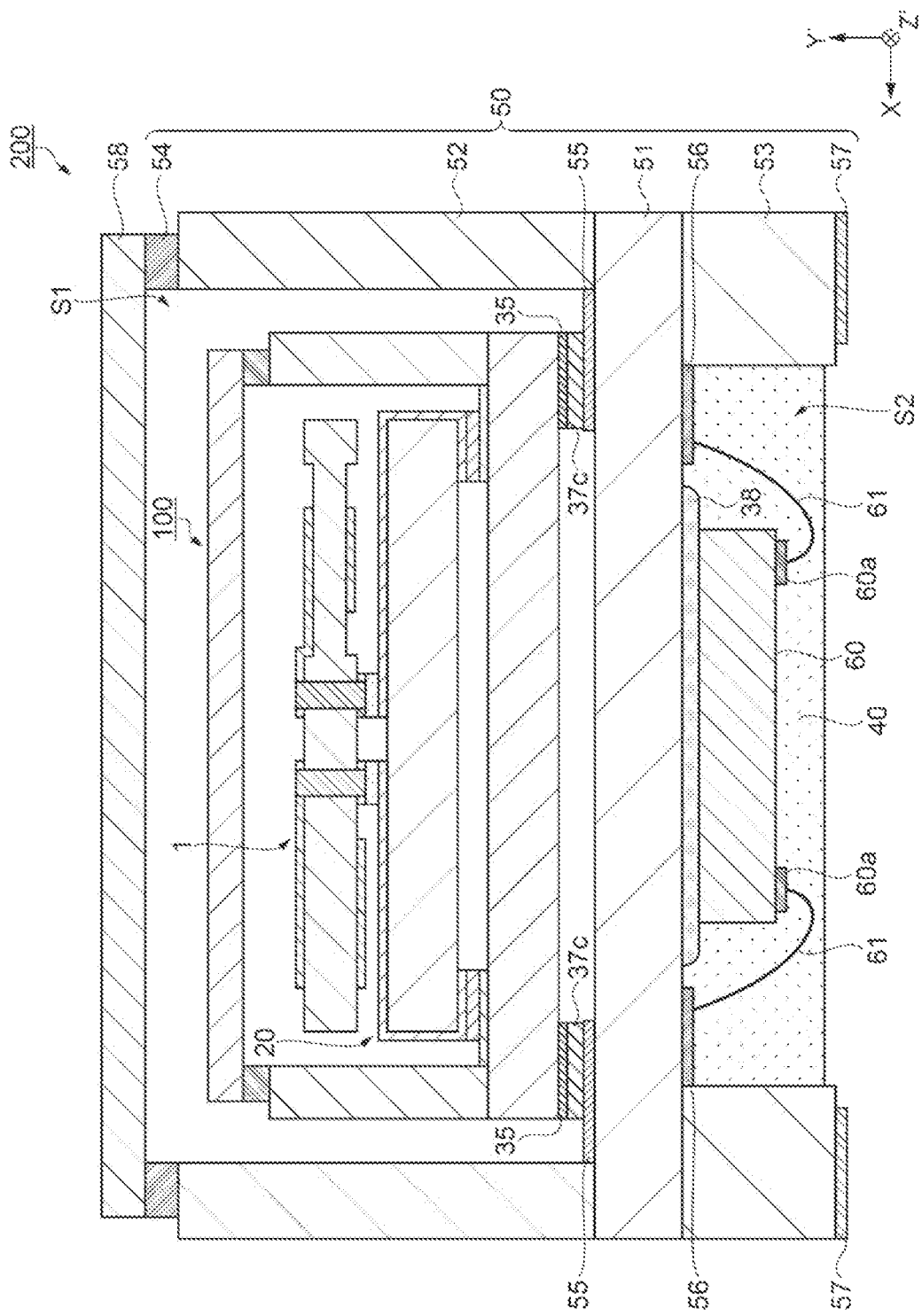
FIG. 25 is a cross-sectional view taken along a line G-G in FIG. 24.

As shown in FIG. 25, the package 50 is formed by stacking mounting terminals 57, third substrates 53, internal terminals 56, a first substrate 51, internal terminals 55, second substrates 52, and seal rings 54. The package 50 has a cavity S1 that opens upward and a cavity S2 that opens downward.

In the cavity S1, the vibrator 100 incorporating the vibrator element 1 and the relay substrate 20 is housed, the mounting terminal 35 of the vibrator 100 and the internal terminal 55 provided above the first substrate 51 are bonded by a bonding member 37c such as a conductive adhesive, and the vibrator 100 is fixed to the package 50. In the cavity S2, the IC chip 60 is housed, the IC chip 60 and the package 50 are bonded by a bonding member 38 such as a non-conductive adhesive, and the IC chip 60 is fixed to the package 50. A coupling terminal 60a provided below the IC chip 60 and the internal terminal 56 provided below the first substrate 51 are electrically coupled via a metal bonding wire 61.

In the cavity S1 that houses the vibrator 100, by bonding the lid member 58 with the seal ring 54, the vibrator 100 is hermetically sealed in a reduced-pressure atmosphere or an inert gas atmosphere such as nitrogen. A mold resin 40 is loaded in the cavity S2 that houses the IC chip 60.

A plurality of mounting terminals 57 are provided at an outer bottom surface of the third substrate 53. The mounting terminal 57 is electrically coupled to, via a side electrode or an interlayer wiring (not shown), the internal terminal 56 provided below the first substrate 51.

The IC chip 60 includes a first oscillation circuit 61a that oscillates the first vibration element X1 and that outputs a first oscillation signal, a second oscillation circuit 61b that oscillates the second vibration element X2 and that outputs a second oscillation signal, a third oscillation circuit 61c that oscillates the third vibration element X3 and that outputs a third oscillation signal, and a control signal output circuit 63 that outputs a control signal for controlling the oscillation frequency of the first oscillation signal based on the second oscillation signal and the third oscillation signal.

Next, a circuit configuration of the oscillator 200 will be described with reference to FIG. 26. In the following description, a TCXO will be described as an example of the oscillator 200.

The control signal output circuit 63 is a circuit that outputs a set frequency $f_0$ from an output end 65 without being influenced by a temperature change outside the oscillator 200 or while reducing the influence of the temperature change outside the oscillator 200. The set frequency $f_0$ is an output frequency obtained when a reference voltage $V_0$ is applied to the first oscillation circuit 61a at a reference temperature $T_0$.

The first oscillation circuit 61a is electrically coupled to the pair of first excitation electrodes 4 of the first vibration element X1 via the terminal 10. Similarly, the second oscillation circuit 61b for temperature detection is electrically coupled to the pair of second excitation electrodes 6 of the second vibration element X2 via the terminal 11. The third oscillation circuit 61c for temperature detection is electrically coupled to the pair of third excitation electrodes 8 of the third vibration element X3 via the terminal 12.

Figure 26:
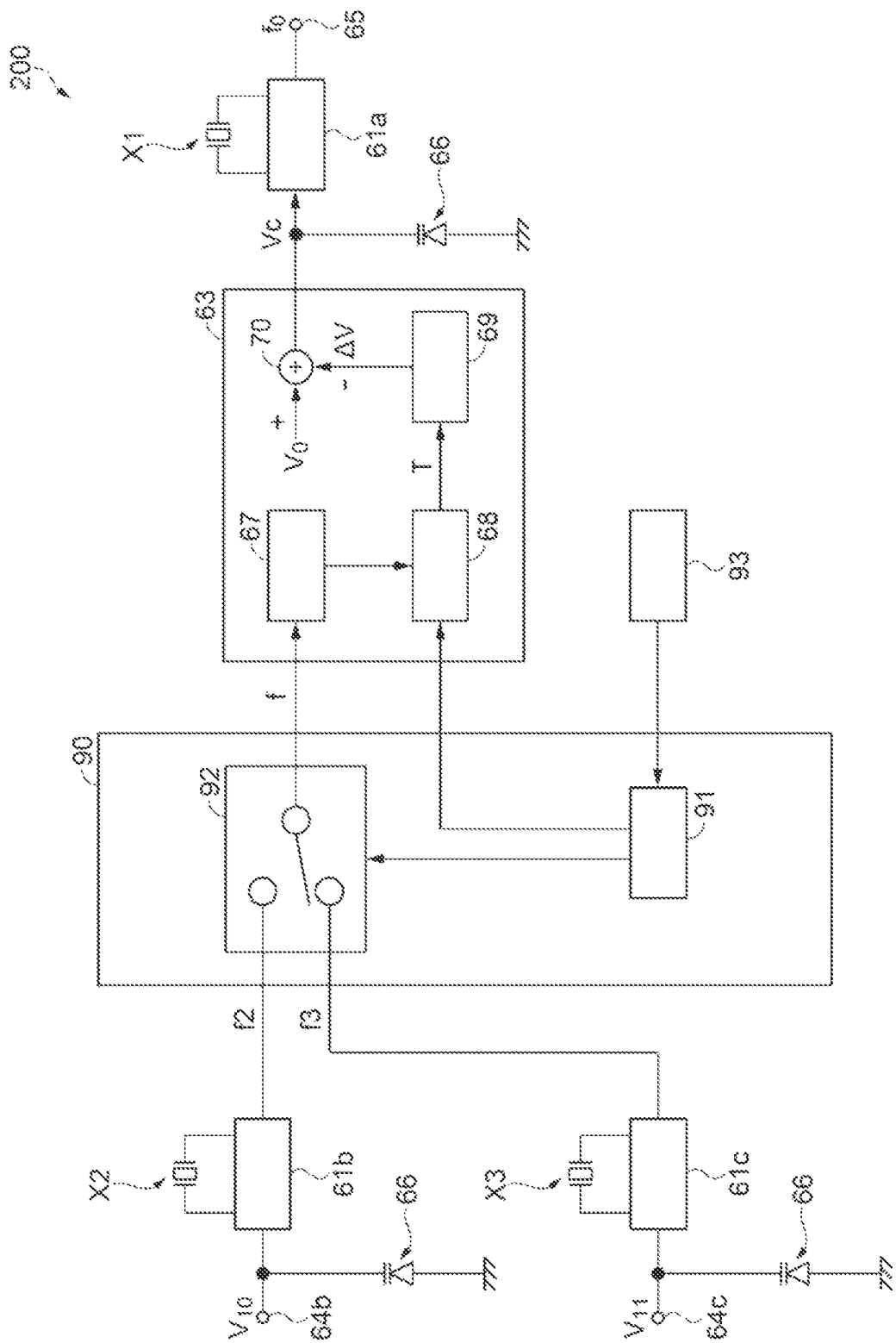
FIG. 26 is a block diagram showing a circuit configuration of the oscillator.

As shown in FIG. 26, between the first oscillation circuit 61a and the second and third oscillation circuits 61b and 61c, an output selection circuit 90 and the control signal output circuit 63 are provided. The output selection circuit 90 selects a frequency f to be output to the control signal output circuit 63. The control signal output circuit 63 estimates the temperature of the first vibration element X1 based on the frequency f, which is an output signal output from the output selection circuit 90, and calculates a control voltage $V_c$ ($V_c=V_0-\Delta V$) serving as a control signal. Based on the control signal, the set frequency $f_0$ serving as the first oscillation signal in the first oscillation circuit 61a at this temperature is obtained.

The output selection circuit 90 includes a selection control unit 91 and an output selection unit 92. The selection control unit 91 is electrically coupled to the output selection unit 92, a temperature sensor 93, and a temperature estimation unit 68. The temperature sensor 93 detects a temperature outside the vibration element 1. Based on the temperature detected by the temperature sensor 93, the selection control unit 91 selects the frequency f to be output to the control signal output circuit 63 from an oscillation frequency f2 serving as the second oscillation signal output from the second oscillation circuit 61b and an oscillation frequency f3 serving as the third oscillation signal output from the third oscillation circuit 61c. Further, the selection control unit 91 controls the output selection unit 92 to switch the frequency f, which is the output signal output from the output selection circuit 90. The output selection unit 92 outputs, based on the selection of the selection control unit 91, one of the oscillation frequency f2 output from the second oscillation circuit 61b and the oscillation frequency f3 output from the third oscillation circuit 61c to the control signal output circuit 63 as the frequency f, which is the output signal output from the output selection circuit 90.

A reference voltage $V_{10}$ is input to the second oscillation circuit 61b from an input end 64b of the second oscillation circuit 61b, a reference voltage $V_{11}$ is input to the third oscillation circuit 61c from an input end 64c of the third oscillation circuit 61c, and the set frequency $f_0$ is output from the output end 65. The reference voltages $V_{10}$ and $V_{11}$ and the control voltage $V_c$ that are stabilized by a varicap diode 66 are respectively input to the first oscillation circuit 61a, the second oscillation circuit 61b, and the third oscillation circuit 61c.

The second vibration element X2 and the third vibration element X3 are used as a temperature detection unit. The oscillation frequency f2 serving as the second oscillation signal output from the second oscillation circuit 61b that drives the second vibration element X2 is output according to a temperature T of the second vibration element X2 based on the frequency-temperature characteristic of the second vibration element X2. The oscillation frequency f3 serving as the third oscillation signal output from the third oscillation circuit 61c that drives the third vibration element X3 is output according to a temperature T of the third vibration element X3 based on the frequency-temperature characteristic of the third vibration element X3. Accordingly, the temperature T of the second vibration element X2 and the temperature T of the third vibration element X3 can be obtained.

The first vibration element X1 is provided at the crystal substrate 2 common to the second vibration element X2 and the third vibration element X3, the first vibration element X1 is coupled to the second vibration element X2 and the third vibration element X3, and there is no difference in heat transfer time. Therefore, it is possible to accurately estimate the temperature T of the first vibration element X1 based on the temperature T of the second vibration element X2 and the temperature T of the third vibration element X3.

Since a cutting angle of the second vibration portion 5 and a cutting angle of the third vibration portion 7 are different, the frequency-temperature characteristic of the second vibration element X2 and the frequency-temperature characteristic of the third vibration element X3 are different. Therefore, for example, when the temperature T of the first vibration element X1 is estimated based on the temperature T of the second vibration element X2 in a temperature range in which the resolution of the temperature change with respect to the frequency change of the second vibration element X2 is higher than that of the third vibration element X3 and the temperature detection can be executed with high accuracy, and when the temperature T of the first vibration element X1 is estimated based on the temperature T of the third vibration element X3 in a temperature range in which the resolution of the temperature change with respect to the frequency change of the third vibration element X3 is higher than that of the second vibration element X2 and the temperature detection can be executed with high accuracy, it is possible to estimate the temperature T of the first vibration element X1 with higher accuracy.

The control signal output circuit 63 calculates the control voltage $V_c$ ($V_c = V_0 - \Delta V$) for outputting the set frequency $f_0$ as the first oscillation signal from the first oscillation circuit 61a based on the temperature T of one of the second vibration element X2 and the third vibration element X3 that has a large frequency change amount in the frequency-temperature characteristic.

Specifically, the control signal output circuit 63 includes a frequency detection unit 67 including, for example, a frequency counter that measures the frequency f output from the output selection circuit 90, the temperature estimation unit 68 that estimates the temperature T based on the frequency f measured by the frequency detection unit 67, a compensation voltage calculation unit 69 that calculates a compensation voltage $\Delta V$ based on the temperature T estimated by the temperature estimation unit 68, and an addition unit 70 that outputs, to the first oscillation circuit 61a, the control voltage $V_c$ obtained by subtracting the compensation voltage $\Delta V$ calculated by the compensation voltage calculation unit 69 from the reference voltage $V_0$.

The temperature estimation unit 68 stores a frequency-temperature characteristic of the second oscillation circuit 61b shown in the following expression (1) and a frequency-temperature characteristic of the third oscillation circuit 61c shown in the following expression (2).

When the output selection unit 92 selects the oscillation frequency f2 output from the second oscillation circuit 61b as the frequency f to be output to the control signal output circuit 63, the temperature estimation unit can obtain the temperature T of the second vibration element X2 based on a frequency-temperature characteristic in the expression (1) and the oscillation frequency f2 output from the second oscillation circuit 61b, and can estimate the temperature T of the first vibration element X1 based on the temperature T of the second vibration element X2.

When the output selection unit 92 selects the oscillation frequency f3 output from the third oscillation circuit 61c as the frequency f to be output to the control signal output circuit 63, the temperature estimation unit 68 can estimate the temperature T of the third vibration element X3 based on a frequency-temperature characteristic in the expression (2) and the oscillation frequency f3 output from the third oscillation circuit 61c, and can estimate the temperature T of the first vibration element X1 based on the temperature T of the third vibration element X3.

$$f1 = f_{10}\{1 + \alpha_2(T-T_{10})^3 + \beta_2(T-T_{10}) + \Gamma_2\} \quad (1)$$

$$f2 = f_{11}\{1 + \alpha_3(T-T_{11})^3 + \beta_3(T-T_{11}) + \gamma_3\} \quad (2)$$

The compensation voltage calculation unit 69 includes, for example, a cubic function generator having a temperature characteristic of the first oscillation circuit 61a. The compensation voltage calculation unit 69 calculates the compensation voltage $\Delta V$ based on the following expressions (3) to (5) and the temperature T.

$$\Delta V = V_0(\Delta f/f_0) \quad (3)$$

$$\Delta f/f_0 = \alpha_1(T-T_0)^3 + \beta_1(T-T_0) + \gamma_1 \quad (4)$$

$$\Delta V = V_0\{\alpha_1(T-T_0)^3 + \beta_1(T-T_0) + \gamma_1\} \quad (5)$$

Here, $\alpha_1$, $\beta_1$, $\gamma_1$, $\alpha_2$, $\beta_2$, $\gamma_2$ and $\alpha_3$, $\beta_3$, $\gamma_3$ are constants specific to the first oscillation circuit 61a, the second oscillation circuit 61b, and the third oscillation circuit 61c, respectively, and are obtained by measuring an output frequency by variously changing the temperature and the reference voltage. Here, $\Delta f = f - f_0$, $f_{10}$ is an output frequency obtained when the reference voltage $V_{10}$ is applied to the second oscillation circuit 61b at a reference temperature $T_{10}$, and $f_{11}$ is an output frequency obtained when the reference voltage $V_{11}$ is applied to the third oscillation circuit 61c at a reference temperature $T_{11}$.

When the control voltage $V_{10}$ is input to the input end 64b of the second oscillation circuit 61b, the second oscillation circuit 61b oscillates due to thickness shear vibration of a fundamental wave at the oscillation frequency f1, which is obtained according to the above expression (1) based on the temperature T of the second vibration element X2. When the control voltage $V_{11}$ is input to the input end 64c of the third oscillation circuit 61c, the third oscillation circuit 61c oscillates due to thickness shear vibration of a fundamental wave at the oscillation frequency f2, which is obtained by the above expression (2) based on the temperature T of the third vibration element X3.

Based on the temperature detected by the temperature sensor 93, the output selection circuit 90 outputs, as the frequency f that is the output signal output from the output selection circuit 90, one of the oscillation frequency f2 serving as the second oscillation signal output from the second oscillation circuit 61b and the oscillation frequency f3 serving as the third oscillation signal output from the third oscillation circuit 61c to the control signal output circuit 63.

The frequency f is input to the temperature estimation unit 68 via the frequency detection unit 67. The temperature estimation unit 68 obtains the temperature T of the second vibration element X2 or the temperature T of the third vibration element X3 based on the selection of the output selection unit 92 of the output selection circuit 90, and estimates the temperature T of the first vibration element X1. Then, in the compensation voltage calculation unit 69, the compensation voltage $\Delta V$ is calculated based on the temperature T estimated by the temperature estimation unit 68, and the control voltage $V_c$ serving as the control signal is applied to the first oscillation circuit 61a via the addition unit 70. The first oscillation circuit 61a vibrates due to thickness shear vibration at the set frequency $f_0$, which is a frequency of a first oscillation signal corresponding to the temperature T of the first vibration element X1 and the control voltage $V_c$.

That is, at the temperature T, the oscillation frequency of the first oscillation circuit 61a tends to deviate from the set frequency $f_0$ according to the frequency-temperature characteristic of the first oscillation circuit 61a by a difference $(T-T_0)$ between the temperature T and the reference temperature $T_0$. However, the control voltage $V_c$ lower or higher than the reference voltage $V_0$ is applied to the first oscillation circuit 61*a* by an amount corresponding to the difference. Therefore, an output frequency in which the difference is canceled out, that is, the set frequency $f_0$ can be obtained.

The oscillator 200 according to the present embodiment includes the vibrator 100 in which the central portion between the first vibration portion 3 of the vibration element 1 and the second and third vibration portions 5 and 7 is fixed to the central portion sandwiched between both the end portions of the relay substrate 20, and in which both the end portions of the relay substrate 20 are fixed to the package 30. Therefore, heat from the outside of the package 30 is less likely to be transferred, and the transferred heat is uniformly transferred from the central portion of the vibration element 1 to the first vibration portion 3, the second vibration portion 5, and the third vibration portion 7. Therefore, the temperature difference between the first vibration portion 3 and the second and third vibration portions 5 and 7 is small. When the first vibration portion 3 is used for oscillation signal output and the second vibration portion 5 and the third vibration portion 7 are used for temperature detection, it is possible to accurately detect the temperature of the first vibration portion 3, and perform the temperature compensation with high accuracy. Therefore, the oscillator 200 having high accuracy in which the set frequency $f_0$ is stable can be implemented.

The frequency-temperature characteristic of the second vibration element X2 and the frequency-temperature characteristic of the third vibration element X3 can be adjusted to characteristics suitable for temperature detection while the frequency-temperature characteristic of the first vibration element X1 is adjusted to a characteristic suitable for oscillation signal output. Therefore, it is possible to quickly perform the temperature compensation with high accuracy on the set frequency $f_0$ output from the first vibration element X1 based on the oscillation frequency f2 of the second vibration element X2 and the oscillation frequency f3 of the third vibration element X3.

In a case in which the frequency-temperature characteristic of the second vibration element X2 and the frequency-temperature characteristic of the third vibration element X3 are different characteristics, when the temperature T of the first vibration element X1 is estimated based on the temperature T, which is in the temperatures detected by the temperature sensor 93, of one of the second vibration element X2 and the third vibration element X3 that has a larger frequency change amount in the frequency-temperature characteristic, it is possible to estimate the temperature T of the first vibration element X1 with higher accuracy. Therefore, the oscillator 200 having high accuracy in which the set frequency $f_0$ is stable can be implemented.

9. Ninth Embodiment

A circuit configuration of an oscillator 200*a* according to a ninth embodiment will be described with reference to FIGS. 27 and 28. The same configurations as those according to the eighth embodiment are denoted by the same reference numerals, and redundant description thereof will be omitted.

In the present embodiment, a sum or a difference between the oscillation frequency f2 of the second vibration element X2 and the oscillation frequency f3 of the third vibration element X3 is obtained, and the frequency f calculated in this manner is used as a temperature detection signal.

Figure 27:
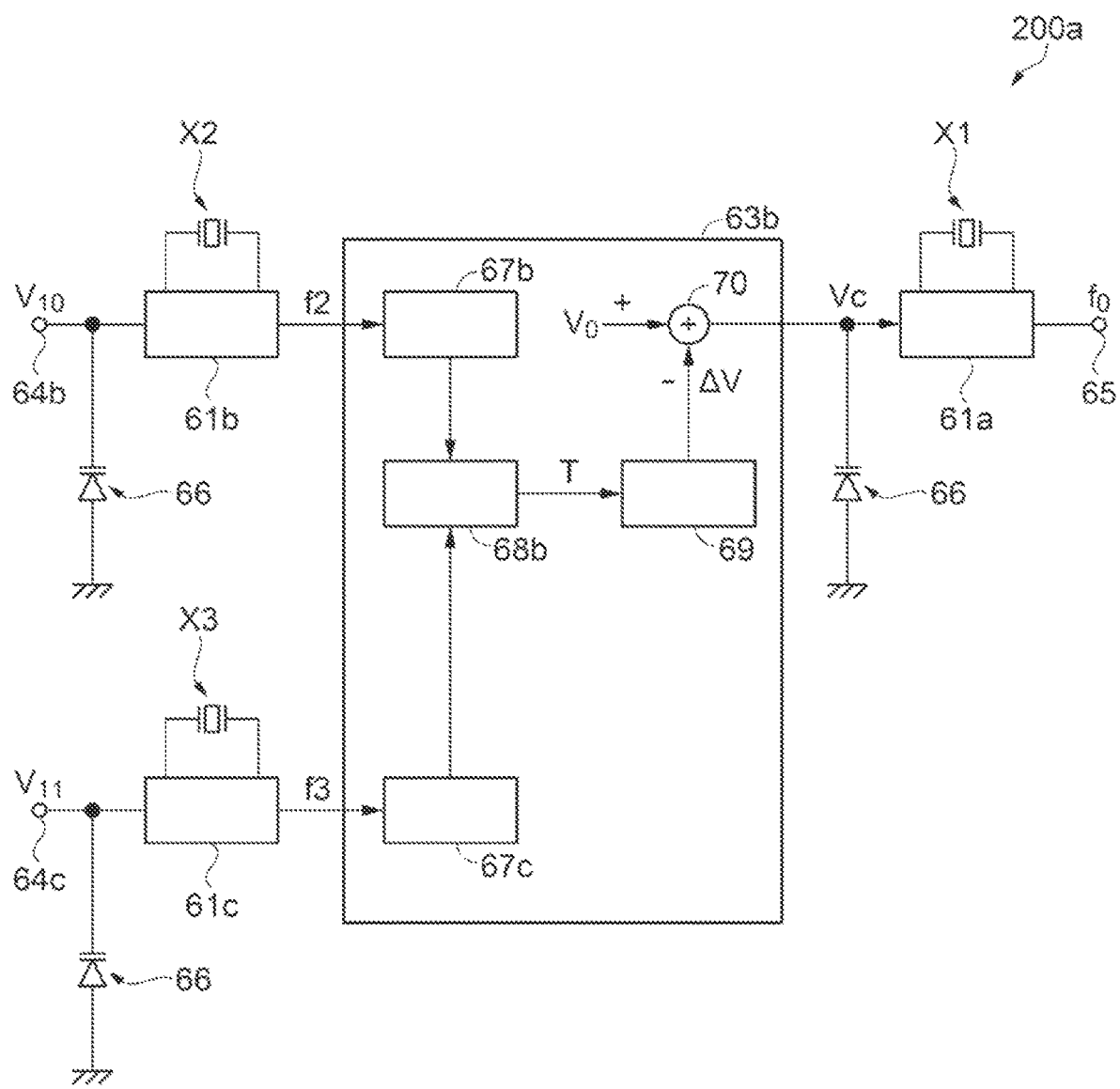
FIG. 27 is a block diagram showing a circuit configuration of an oscillator according to a ninth embodiment.

As shown in FIG. 27, between the first oscillation circuit 61*a* and the second and third oscillation circuits 61*b* and 61*c*, a control signal output circuit 63*b* is provided. The control signal output circuit 63*b* estimates the temperature of the first vibration element X1 based on the oscillation frequency f2 serving as the second oscillation signal output from the second oscillation circuit 61*b* of the second oscillation element X2 and the oscillation frequency f3 serving as the third oscillation signal output from the third oscillation circuit 61*c* of the third oscillation element X3, and calculates a control voltage $V_c$ ($V_c=V_0-\Delta V$) serving as a control signal. Based on the control signal, the set frequency $f_0$ serving as the first oscillation signal in the first oscillation circuit 61*a* at this temperature is obtained.

The control signal output circuit 63*b* includes frequency detection units 67*b* and 67*c*, a temperature estimation unit 68*b*, the compensation voltage calculation unit 69, and the addition unit 70.

The oscillation frequency f2 output from the second oscillation circuit 61*b* is input to the temperature estimation unit 68*b* via the frequency detection unit 67*b*. The oscillation frequency f3 output from the third oscillation circuit 61*c* is input to the temperature estimation unit 68*b* via the frequency detection unit 67*c*.

The temperature estimation unit 68*b* calculates a difference (f3−f2) between the oscillation frequency f2 and the oscillation frequency f3, and estimates the temperature T of the first vibration element X1 based on the calculated frequency difference (f3−f2), and relation data between the frequency difference (f3−f2) and the temperature T.

Figure 28:
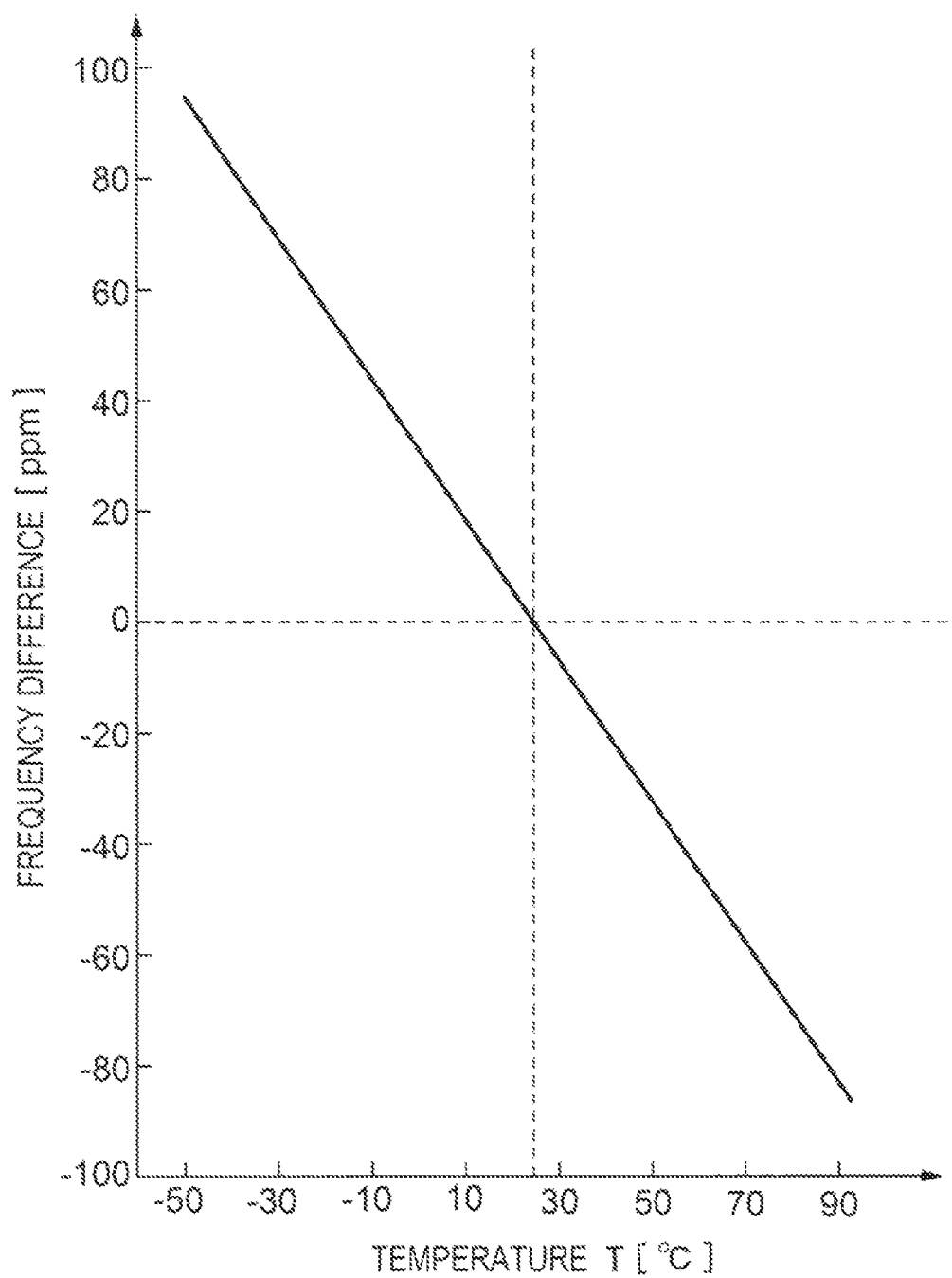
FIG. 28 is a diagram showing an example of relation between a difference in frequency change amount of a vibrator and a temperature.

FIG. 28 shows an example of the relation data between the frequency difference (f3−f2) and the temperature T. The relation data is calculated by subtracting a cubic curve that is the frequency-temperature characteristic of the third vibration element X3 from a cubic curve that is the frequency-temperature characteristic of the second vibration element X2. As can be seen from FIG. 28, the calculated frequency difference (f3−f2) is substantially proportional to the temperature T.

The temperature estimation unit 68*b* includes a storage unit that stores the relation data between the frequency difference (f3−f2) and the temperature T, a calculation unit that calculates the difference (f3−f2) between the oscillation frequency f2 and the oscillation frequency f3, and a reading unit that reads the temperature T corresponding to the frequency difference (f3−f2) from the relation data stored in the storage unit (not shown).

Instead of obtaining the difference (f3−f2) between the oscillation frequency f2 and the oscillation frequency f3, the sum (f2+f3) of the oscillation frequency f2 and the oscillation frequency f3 may be obtained, and the temperature T may be obtained with reference to relation data between the sum (f2+f3) of the frequencies and the temperature T. Instead of calculating the difference between the oscillation frequency f2 and the oscillation frequency f3, a difference between V2 obtained by voltage-converting the oscillation frequency f2 and V3 obtained by voltage-converting the oscillation frequency f3 may be obtained, and the temperature T may be obtained with reference to relation data between the voltage difference (V3−V2) and the temperature T.

In the oscillator 200*a* according to the present embodiment, the frequency-temperature characteristic of the second vibration element X2 and the frequency-temperature characteristic of the third vibration element X3 can be adjusted to characteristics suitable for temperature detection while the frequency-temperature characteristic of the first vibration element X1 is adjusted to a characteristic suitable for oscillation signal output. Therefore, it is possible to quickly perform the temperature compensation with high accuracy on the set frequency $f_0$ output from the first vibration element X1 based on the oscillation frequency f2 of the second vibration element X2 and the oscillation frequency f3 of the third vibration element X3. Therefore, the oscillator 200a having high accuracy in which the set frequency $f_0$ is stable can be implemented.

In a case in which the frequency-temperature characteristic of the second vibration element X2 and the frequency-temperature characteristic of the third vibration element X3 are different characteristics, when the temperature T of the first vibration element X1 is estimated based on the sum or the difference between the oscillation frequency f2 of the second vibration element X2 and the oscillation frequency f3 of the third vibration element X3, it is possible to estimate the temperature T of the first vibration element X1 with higher accuracy. Therefore, the oscillator 200a having high accuracy in which the set frequency $f_0$ is more stable can be implemented.

What is claimed is:

1. A vibrator comprising:
   a vibration element that includes
      a crystal substrate that includes
         a first vibration portion,
         a second vibration portion that is provided on one side of the first vibration portion in a first direction, and
         a third vibration portion that is provided on the one side and that is provided side by side with the second vibration portion along a second direction orthogonal to the first direction,
      a pair of first excitation electrodes formed at two main surfaces of the crystal substrate in the first vibration portion,
      a pair of second excitation electrodes that sandwich the second vibration portion in a thickness direction of the crystal substrate in the second vibration portion, in which at least one second excitation electrode of the pair of second excitation electrodes is formed at a first inclined surface that is inclined with respect to the two main surfaces, and
      a pair of third excitation electrodes that sandwich the third vibration portion in the thickness direction of the crystal substrate in the third vibration portion, in which at least one third excitation electrode of the pair of third excitation electrodes is formed at a second inclined surface, the second inclined surface being inclined with respect to the two main surfaces and the second inclined surface being inclined with respect to the first inclined surface; and
   a package that houses the vibration element, wherein
   the vibration element includes a fixing portion to be fixed to the package, and
   the fixing portion is provided between the first vibration portion and the second and third vibration portions.

2. The vibrator according to claim 1, further comprising:
   a relay substrate fixed to the package, wherein
   the vibration element is fixed to the relay substrate at the fixing portion, and is fixed to the package via the relay substrate.

3. The vibrator according to claim 2, wherein
   the relay substrate is fixed to the package at both end portions of the relay substrate, and
   the fixing portion of the vibration element is fixed to the relay substrate at a central portion between both the end portions of the relay substrate.

4. The vibrator according to claim 2, wherein
   the relay substrate includes
      a frame-shaped first frame portion to be fixed to the package,
      a frame-shaped second frame portion provided inside the first frame portion,
      a vibration element support portion that is provided inside the second frame portion and to which the vibration element is to be fixed,
      a first beam portion that extends along the second direction and that couples the first frame portion and the second frame portion, and
      a second beam portion that extends along the first direction and that couples the second frame portion and the vibration element support portion.

5. The vibrator according to claim 2, wherein
   the relay substrate includes
      a frame-shaped first frame portion to be fixed to the package,
      a vibration element support portion that is provided inside the first frame portion and to which the vibration element is to be fixed, and
      a first beam portion that extends along the second direction and that couples the first frame portion and the vibration element support portion.

6. The vibrator according to claim 1, wherein
   a cutting angle of the first inclined surface is smaller than a cutting angle of the two main surfaces, and
   a cutting angle of the second inclined surface is larger than the cutting angle of the two main surfaces.

7. The vibrator according to claim 1, wherein
   the first vibration portion, the second vibration portion, and the third vibration portion have different frequency-temperature characteristics.

8. The vibrator according to claim 7, wherein
   the frequency-temperature characteristics of the second vibration portion and the third vibration portion have a larger frequency change amount than the frequency-temperature characteristic of the first vibration portion.

9. The vibrator according to claim 1, wherein
   the second vibration portion has a surface parallel to the first inclined surface on a back side of the first inclined surface, and
   the third vibration portion has a surface parallel to the second inclined surface on a back side of the second inclined surface.

10. The vibrator according to claim 1, wherein
    the first inclined surface and the second inclined surface are inclined such that thicknesses of the second vibration portion and the third vibration portion become smaller as the first inclined surface and the second inclined surface approach each other.

11. The vibrator according to claim 1, wherein
    the first vibration portion has a convex portion formed at at least one of the main surfaces.

12. The vibrator according to claim 1, wherein
    the vibration element has a through hole between the first vibration portion and the second and third vibration portions.

13. An oscillator comprising:
    the vibrator according to claim 1;
    a first oscillation circuit that is electrically coupled to a first excitation electrode and that outputs a first oscillation signal;
    a second oscillation circuit that is electrically coupled to a second excitation electrode and that outputs a second oscillation signal;

a third oscillation circuit that is electrically coupled to a third excitation electrode and that outputs a third oscillation signal; and a control signal output circuit to which at least one of the second oscillation signal and the third oscillation signal is input and that outputs, based on the input signal, a control signal for controlling an oscillation frequency of the first oscillation signal.

14. The oscillator according to claim 13, further comprising:

a temperature sensor; and an output selection circuit to which the second oscillation signal and the third oscillation signal are input and that selectively outputs the second oscillation signal or the third oscillation signal based on a temperature detection result of the temperature sensor, wherein the control signal output circuit outputs the control signal based on an output signal of the output selection circuit.

15. The oscillator according to claim 14, wherein the output selection circuit selects and outputs one of the second oscillation signal and the third oscillation signal that has a larger frequency change amount in a frequency-temperature characteristic among temperatures detected by the temperature sensor.

* * * * *